(12) United States Patent
Toyoda

(10) Patent No.: US 11,502,164 B2
(45) Date of Patent: Nov. 15, 2022

(54) METHOD OF MANUFACTURING SEMICONDUCTOR INTEGRATED CIRCUIT

(71) Applicant: FUJI ELECTRIC CO., LTD., Kawasaki (JP)

(72) Inventor: Yoshiaki Toyoda, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 142 days.

(21) Appl. No.: 17/141,757

(22) Filed: Jan. 5, 2021

(65) Prior Publication Data

US 2021/0126088 A1  Apr. 29, 2021

Related U.S. Application Data

(62) Division of application No. 16/362,038, filed on Mar. 22, 2019, now Pat. No. 10,916,624.

(30) Foreign Application Priority Data

May 17, 2018 (JP) ............................... JP2018-95166

(51) Int. Cl.
*H01L 29/06* (2006.01)
*H01L 29/78* (2006.01)
(Continued)

(52) U.S. Cl.
CPC .... *H01L 29/0615* (2013.01); *H01L 21/76224* (2013.01); *H01L 27/088* (2013.01); *H01L 29/66734* (2013.01); *H01L 29/7813* (2013.01)

(58) Field of Classification Search
None
See application file for complete search history.

(56) References Cited

U.S. PATENT DOCUMENTS 6,323,518 B1  11/2001  Sakamoto et al.
9,209,296 B2  12/2015  Toyoda
(Continued)

FOREIGN PATENT DOCUMENTS

JP   5-283629 A    10/1993
JP   11-145457 A   5/1999
(Continued)

OTHER PUBLICATIONS

Japanese Office Action dated Feb. 1, 2022 from Japanese Patent Application No. 2018-095166, 7 pages.
(Continued)

*Primary Examiner* — Robert K Carpenter

(57) ABSTRACT

A method of manufacturing a semiconductor integrated circuit includes forming a body region having a second conductivity type in an upper portion of a support layer having a first conductivity type and forming a well region having a second conductivity type in an upper portion of the support layer. An output side buried layer is formed inside the body region and a circuit side buried layer is formed inside the well region. A trench is dug to penetrate through the body region and a control electrode structure is buried in the gate trench. First and second terminal regions are formed on the well region and an output terminal region is formed on the body region. An output stage element having the output terminal region is controlled by a circuit element including the first and second terminal regions.

6 Claims, 30 Drawing Sheets

(51) Int. Cl.
  *H01L 29/66* (2006.01)
  *H01L 27/088* (2006.01)
  *H01L 21/762* (2006.01)

(56) References Cited

U.S. PATENT DOCUMENTS

| | | |
|---|---|---|
| 9,450,084 B2 | 9/2016 | Ueon |
| 9,502,496 B2 | 11/2016 | Toyoda |
| 9,543,217 B2 | 1/2017 | Toyoda et al. |
| 10,916,624 B2 * | 2/2021 | Toyoda ............. H01L 29/66734 |
| 2006/0054970 A1 | 3/2006 | Yanagida et al. |
| 2007/0166905 A1 | 7/2007 | Yanagida et al. |
| 2010/0270586 A1 | 10/2010 | Ueno |
| 2014/0008718 A1 | 1/2014 | Toyoda |
| 2016/0043166 A1 | 2/2016 | Toyoda |
| 2016/0254198 A1 | 9/2016 | Toyoda et al. |
| 2019/0355808 A1 | 11/2019 | Toyoda |

FOREIGN PATENT DOCUMENTS

| | | |
|---|---|---|
| JP | 11-214682 A | 8/1999 |
| JP | 2000-91344 A | 3/2000 |
| JP | 2006-80177 A | 3/2006 |
| JP | 3886855 B2 | 12/2006 |
| JP | 2009-170480 A | 7/2009 |
| JP | 2010-258328 A | 11/2010 |
| JP | 2013-122948 A | 6/2013 |
| JP | 5641131 B2 | 11/2014 |
| JP | 5809877 B2 | 9/2015 |
| JP | 6037085 B2 | 11/2016 |

OTHER PUBLICATIONS

Restriction Requirement from U.S. Appl. No. 16/362,038 dated May 1, 2020.

Notice of Allowance from U.S. Appl. No. 16/362,038 dated Oct. 8, 2020.

* cited by examiner

METHOD OF MANUFACTURING SEMICONDUCTOR INTEGRATED CIRCUIT

CROSS-REFERENCE TO RELATED APPLICATIONS

This application is a divisional of U.S. application Ser. No. 16/362,038 filed Mar. 22, 2019 which claims benefit of priority under 35 USC 119 based on Japanese Patent Application No. 2018-95166 filed on May 17, 2018, the entire contents of both of which are incorporated by reference herein.

BACKGROUND OF THE INVENTION

1. Field of the Invention

The present invention relates to a semiconductor integrated circuit and a method of manufacturing the semiconductor integrated circuit, and more particularly, to a power semiconductor integrated circuit (power IC) configured by integrating a vertical power semiconductor element implementing an output stage element and a lateral semiconductor element (circuit element) for controlling the power semiconductor element on the same semiconductor chip and a method of manufacturing the power semiconductor integrated circuit.

2. Description of the Related Art

For the purpose of high reliability, miniaturization and cost reduction of a power semiconductor element, a power IC in which a vertical MOSFET as a power semiconductor element at an output stage and a lateral MOSFET for a circuit for controlling a power semiconductor element are monolithically integrated (mixed) on the same semiconductor chip has been proposed (refer to JP 2000-91344 A, JP 5641131 B2, and JP 6037085 B2). In addition, techniques for improving characteristics of a vertical MOSFET alone have been proposed (refer to JP 11-145457 A, JP 2006-80177 A, and JP 5809877 B2). In addition, techniques for improving characteristics of parasitic structures such as punch-through immunity and parasitic capacitance of a MOSFET and the like have been proposed (refer to JP 5-283629 A, JP 11-214682 A, JP 2013-122948 A, and JP 3886855 B2).

However, in these patent literatures, in the power IC in which the vertical output stage element and the lateral circuit element are integrated in the same semiconductor chip, a method for efficiently improving the characteristics of the output stage element and the characteristics of the parasitic structure of the circuit element by harmonizing both the characteristics is not considered.

SUMMARY OF THE INVENTION

In view of the above-described problem, the present invention is to provide a semiconductor integrated circuit capable of efficiently improving characteristics of an output stage element having a vertical structure and characteristics of a circuit element implementing a lateral structure for controlling an output stage element by harmonizing both the characteristics and a method of manufacturing the semiconductor integrated circuit.

An aspect of the present invention inheres in a semiconductor integrated circuit, encompassing: a support layer having a first conductivity type; a well region having a second conductivity type provided in an upper portion of the support layer; a circuit side buried layer having a second conductivity type having an impurity concentration higher than that of the well region provided inside the well region; first and second terminal regions having a first conductivity type provided in an upper portion of the well region and above the circuit side buried layer; a body region having a second conductivity type provided in an upper portion of the support layer to be separated from the well region; a control electrode structure provided in a gate trench so as to penetrate through the body region and reach the support layer; an output side buried layer having a second conductivity type provided inside the body region so as to be in contact with the control electrode structure and having an impurity concentration higher than that of the body region; and an output terminal region having a first conductivity type provided in an upper portion of the body region and above the output side buried layer, wherein an output stage element having the output terminal region is controlled by a circuit element including the first and second terminal regions.

Another aspect of the present invention inheres in a method of manufacturing a semiconductor integrated circuit, encompassing: forming a body region having a second conductivity type in an upper portion of a support layer having a first conductivity type; forming a well region having a second conductivity type in an upper portion of the support layer to be separated from the body region; forming an output side buried layer having a second conductivity type having an impurity concentration higher than that of the body region inside the body region; forming a circuit side buried layer having a second conductivity type having an impurity concentration higher than that of the well region inside the well region; digging a gate trench penetrating through the body region and reaching the support layer; burying a control electrode structure in the gate trench; forming first and second terminal regions having a first conductivity type on the well region so as to face each other; and forming an output terminal region having a first conductivity type on the body region, wherein an output stage element having the output terminal region is controlled by a circuit element including the first and second terminal regions.

Still another aspect of the present invention inheres in a method of manufacturing a semiconductor integrated circuit, encompassing: forming a well region having a second conductivity type in an upper portion of a support layer having a first conductivity type; forming a circuit side buried layer having a second conductivity type having an impurity concentration higher than that of the well region inside the well region; forming an output side buried layer having a second conductivity type having an impurity concentration higher than that of the well region inside the well region to be separated from the circuit side buried layer; digging an element isolation trench penetrating through the well region and reaching the support layer and isolating the well region into a plurality of regions to form a first well region provided with the circuit side buried layer and a body region provided with the output side buried layer; digging a gate trench penetrating through the body region and reaching the support layer at the same time as the element isolation trench; burying a control electrode structure in the gate trench; forming first and second terminal regions having a first conductivity type on the first well region to face each other; and forming an output terminal region having a first conductivity type on the body region, wherein an output stage element having the output terminal region is controlled by a circuit element including the first and second terminal regions.

DETAILED DESCRIPTION OF THE INVENTION

Figure 1:
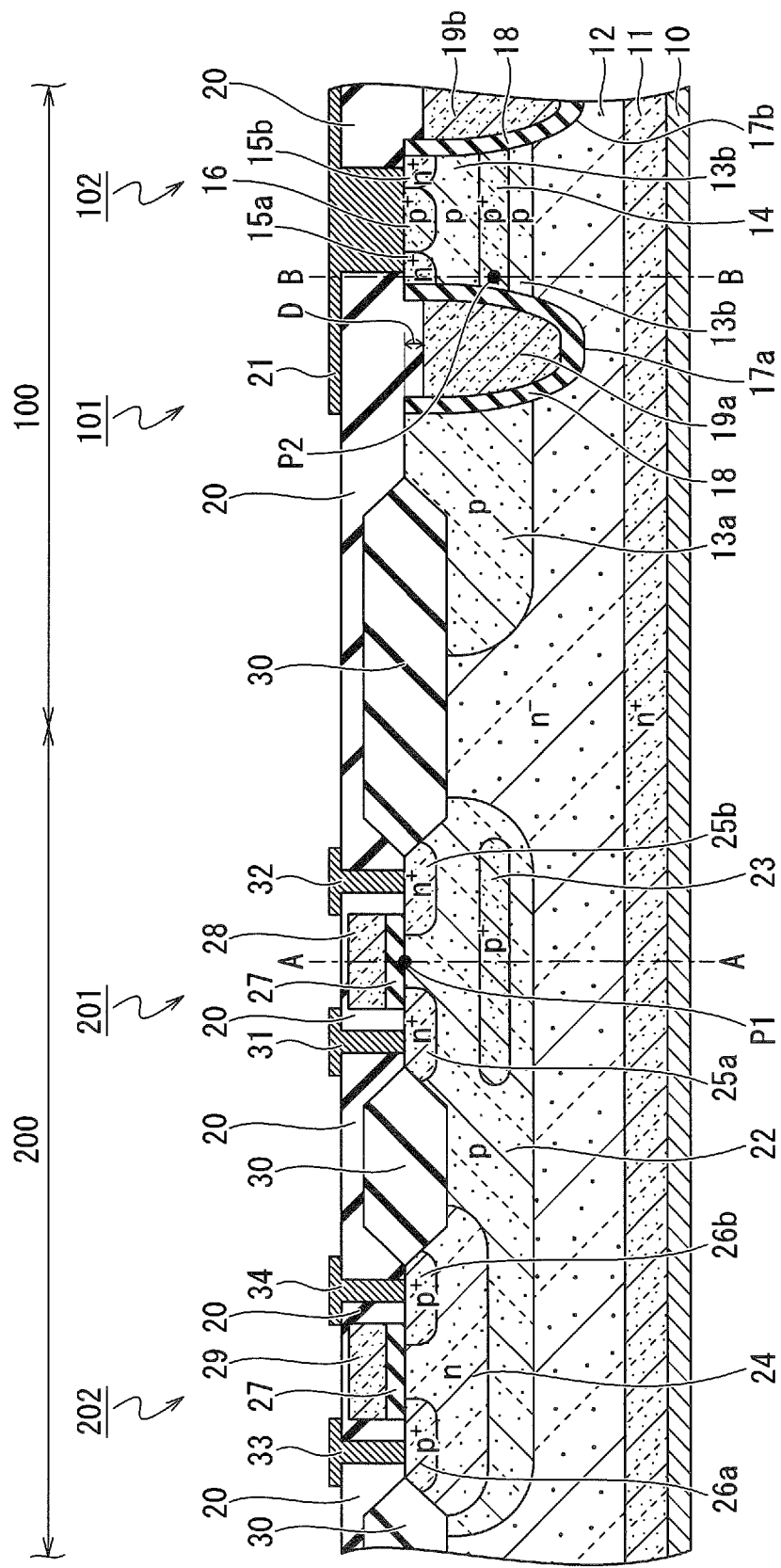
FIG. 1 is a cross-sectional view of main components illustrating an example of a semiconductor integrated circuit according to an embodiment of the present invention.

With reference to the drawings, an embodiments of the present invention will be explained in detail below. In the following description of the drawings, the same or similar reference numerals are assigned to the same or similar portions. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the embodiment of the present invention, various semiconductor elements are monolithically integrated in a semiconductor integrated circuit. In the embodiment of the present invention, a "first terminal region" and a "second terminal region" of a first circuit element (semiconductor element) integrated in a circuit unit is assigned to a source region or a drain region in a field-effect transistor (FET) or a static induction transistor (SIT), in which a main current flows in or out. In some appropriate cases, a function of the first terminal region and a function of the second terminal region are exchangeable each other by exchanging a bias relationship if the structure of the subject semiconductor device is symmetric such as metal-insulator-semiconductor (MIS) FET. A "third terminal region" and a "fourth terminal region" of a second circuit element (semiconductor element) integrated in the circuit unit are similarly defined. When the third terminal region is the source region, the fourth terminal region means the drain region.

In the present specification, a "first main-electrode region" and a "second main-electrode region" are defined in an output stage portion. The first main-electrode region and the second main-electrode region has a relationship the same as the first terminal region and the second terminal region. The first main-electrode region and the second main-electrode region are a main-electrode region of the output stage element (semiconductor element), in which a main current flows in or out. The first main-electrode region of the semiconductor element integrated as the output stage element is assigned to a semiconductor region which is an emitter region or a collector region in an insulated-gate bipolar transistor (IGBT). The first main-electrode region of the integrated output stage element is assigned to a semiconductor region which is an anode region or a cathode region in a static induction (SI) thyristor or a gate turn-off (GTO) thyristor. The second main-electrode region of the integrated output stage element is assigned to a semiconductor region which is not assigned as the first main-electrode region and will be the source region or the drain region in the FET or the SIT, the emitter region or the collector region in the IGBT, and the anode region or the cathode region in the SI thyristor or the GTO thyristor.

That is, when the first main-electrode region of the output stage element integrated in a semiconductor chip is the source region, the second main-electrode region means the drain region. When the first main-electrode region is the emitter region, the second main-electrode region means the collector region. When the first main-electrode region is the anode region, the second main-electrode region means the cathode region. An "output terminal region" is described in the Specification, the output terminal region comprehensively means any one of the first main-electrode region and the second main-electrode region.

Further, definitions of directions such as an up and down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity type is an n-type and a second conductivity type is a p-type. However, the relationship of the conductivity types may be inverted to set the first conductivity type to the p-type and the second conductivity type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

<Semiconductor Integrated Circuit>

A high side power IC will be described as an example of a semiconductor integrated circuit according to an embodiment of the present invention. As illustrated in FIG. 1, the semiconductor integrated circuit according to the embodiment of the present invention is a power IC in which an output unit 100 and a circuit unit 200 are monolithically integrated on the same semiconductor chip.

The output unit 100 has an output stage element (101, 102) which is a vertical power semiconductor element. In the semiconductor integrated circuit according to the embodiment, a case where the output stage element (101, 102) is a trench gate vertical nMOSFET is exemplified. In the output stage element (101, 102), a main current flows between the first main-electrode regions (source regions) 15a and 15b on the upper surface side and the second main electrode region (drain region) on the lower surface (back surface) side through two channels on both sides. For this reason, the back surface contact layer 11 functions as a drain region (second main electrode region), and the support layer 12 functions as a drift layer. On the back surface side of the back surface contact layer 11, a back surface electrode 10 which is a drain electrode is stacked, and the back surface electrode 10 is connected to a power supply voltage terminal.

In the semiconductor integrated circuit according to the embodiment, a case where the semiconductor base body (11, 12) implementing the semiconductor chip is formed by using a semiconductor material made of silicon (Si) as a base material will be exemplarily described, but the base material is not limited to Si. In addition, in FIG. 1, the structure of the semiconductor base body (11, 12) is exemplified where the support layer 12 having a first conductivity type (n⁻-type) having a concentration lower than that of the back surface contact layer 11 is epitaxially grown on the back surface contact layer 11 configured with a semiconductor substrate (Si wafer) having a first conductivity type (n⁺-type) having a high concentration. In addition, the semiconductor base body (11, 12) may be configured by forming the back surface contact layer 11 configured with an n$^+$-type diffusion layer on the back surface of an n$^-$-type semiconductor substrate (Si wafer) to be the support layer 12 by ion implantation or thermal diffusion.

In a case where the semiconductor substrate is used as the back surface contact layer 11, the impurity concentration of the back surface contact layer 11 may be, for example, about $2\times10^{18}$ cm$^{-3}$ to $1\times10^{19}$ cm$^{-3}$, which can be easily obtained on the market. In this case, the impurity concentration of the support layer 12 can be selected to be, for example, about $1\times10^{12}$ cm$^{-3}$ to $1\times10^{16}$ cm$^{-3}$, and herein, for example, about $1\times10^{15}$ cm$^{-3}$ to $1\times10^{16}$ cm$^{-3}$. In a case where the back surface contact layer 11 is formed with the n$^+$-type diffusion layer on the back surface of the support layer 12 configured with an n$^-$-type semiconductor substrate, the impurity concentration of the back surface contact layer 11 can be set to be, for example, about $5\times10^{18}$ cm$^{-3}$ to $1\times10^{21}$ cm$^{-3}$. In addition, the impurity concentration of the back surface contact layer 11 may not be constant but may be a profile such that the concentration is as high as about $1\times10^{21}$ cm$^{-3}$ at the interface with the back surface electrode (not illustrated) connected to the back surface contact layer 11. For example, a composite structure of a layer of about $5\times10^{18}$ cm$^{-3}$ to $2\times10^{19}$ cm$^{-3}$ on the support layer 12 side and a layer of about $3\times10^{19}$ cm$^{-3}$ to $1\times10^{21}$ cm$^{-3}$ on the back surface electrode side may be used.

In the output unit 100, body regions (base regions) 13a and 13b having a second conductivity type (p-type) are provided in an upper portion of the support layer 12. A p$^+$-type output side buried layer 14 having a concentration higher than those of the body regions 13a and 13b is provided inside the body region 13b. The peak concentration of the output side buried layer 14 is higher than the peak concentration of the body regions 13a and 13b. The output side buried layer 14 is buried at a position having a certain depth from the upper surface of the body region 13b.

n$^+$-type first main-electrode regions 15a and 15b having a concentration higher than that of the support layer 12 are selectively stacked above the output side buried layer 14 and on the upper portion of the body region 13b. A p$^+$-type base contact region 16 is selectively stacked above the output side buried layer 14 and on the upper portion of the body region 13b so as to be in contact with the first main-electrode regions 15a and 15b. An output terminal wiring (source electrode wiring) 21 is stacked on the base contact region 16 and the first main-electrode regions 15a and 15b, and the output terminal wiring 21 is connected to the output terminal. For this reason, in the semiconductor integrated circuit according to the embodiment of the present invention, the first main-electrode regions 15a and 15b are defined as "output terminal regions".

Gate trenches 17a and 17b of vertical side walls which penetrate through the body regions 13a and 13b from the upper surfaces of the body regions 13a and 13b and reach the support layer 12 are provided. A trench type control electrode structure (18, 19a, 19b) is configured in the gate trenches 17a and 17b in such a manner that the gate electrodes 19a and 19b are buried through the gate insulating film 18 provided along the inner surfaces of the gate trenches 17a and 17b.

As the gate insulating film 18, for example, an SiO$_2$ film or the like can be used, and besides the SiO$_2$ film, a silicon oxynitride (SiON) film, a strontium oxide (SrO) film, a silicon nitride (Si$_3$N$_4$) film, or an aluminum oxide (Al$_2$O$_3$) film may also be used. Alternatively, even a magnesium oxide (MgO) film, an yttrium oxide (Y$_2$O$_3$) film, a hafnium oxide (HfO$_2$) film, a zirconium oxide (ZrO$_2$) film, a tantalum oxide (Ta$_2$O$_5$) film, or a bismuth oxide (Bi$_2$O$_3$) may also be used. In addition, a composite film obtained by selecting and stacking some of these single layer films may be used.

The gate electrodes 19a and 19b electrostatically control the surface potential of the semiconductor region on the side surface sides of the gate trenches 17a and 17b of the body region 13b and the output side buried layer 14 through the gate insulating film 18, so that an inverted channel is formed on the side surface sides of the gate trenches 17a and 17b of the body region 13b and the output side buried layer 14. As the material of the gate electrodes 19a and 19b, for example, polysilicon (doped polysilicon) into which n-type impurities having a high concentration are introduced can be used, and besides the doped polysilicon (DOPOS), a refractory metal such as tungsten (W), molybdenum (Mo), or titanium (Ti) or a silicide of a refractory metal and polysilicon can be used. In addition, the material of the gate electrodes 19a and 19b may be a polycide which is a composite film of polysilicon and a silicide of a refractory metal.

Herein, when the gate electrodes 19a and 19b of the output stage element (101, 102) are formed, the DOPOS buried inside the gate trenches 17a and 17b is excessively removed by etch-back although depending on the process, and thus, the upper surfaces of the gate electrodes 19a and 19b drop below the upper ends of the gate trenches 17a and 17b. Due to a variation in a dropping amount D of the gate electrodes 19a and 19b, a variation in the formation position (diffusion depth) of the first main-electrode regions 15a and 15b occurs in the vicinity of the upper surfaces of the gate electrodes 19a and 19b.

An interlayer insulating film 20 is stacked on the gate electrodes 19a and 19b. As the interlayer insulating film 20, for example, a silicon oxide film (BPSG film) doped with phosphorus and boron can be used.

On the other hand, the circuit unit 200 includes a first circuit element 201 and a second circuit element 202 which control the output stage element (101, 102). For example, a complementary MOS (CMOS) in which the first circuit element 201 is a lateral nMOSFET and the second circuit element 202 is a pMOSFET can be adopted. The first circuit element 201 is provided in a well region (first well region) 22 having a second conductivity type (p-type) provided in an upper portion of the support layer 12. In the semiconductor integrated circuit according to the embodiment of the present invention, the first well region 22 has substantially the same impurity concentration as those of the body regions 13a and 13b on the output unit 100 side and is provided at a depth substantially equal to those of the body regions 13a and 13b. The depth of the first well region 22 is smaller than the depth of the gate trenches 17a and 17b. The first well region 22 can be formed in the same process as the body regions 13a and 13b on the output unit 100 side, and an increase in the number of processes can be suppressed.

In the first circuit element 201, a first terminal region (source region) 25a having a first conductivity type (n$^+$-type) and a second terminal region (drain region) 25b having a first conductivity type (n$^+$-type) are formed to face each other in an upper portion of the first well region 22. The first terminal region 25a and the second terminal region 25b are n$^+$-type semiconductor regions which are selectively provided to be separated from each other in the upper portion of the first well region 22 and have a concentration higher than that of the support layer 12. In the semiconductor integrated circuit according to the embodiment of the present invention, the first and the second terminal regions 25a and 25b and the first main-electrode regions 15a and 15b on the output unit 100 side have substantially the same impurity concentration and are provided at the same depth. The first and second terminal regions 25a and 25b and the first main-electrode regions 15a and 15b on the output unit 100 side can be formed in the same process, and thus, it is possible to suppress an increase in the number of processes.

A $p^+$-type circuit side buried layer 23 having a concentration higher than that of the first well region 22 is selectively provided inside the first well region 22. The circuit side buried layer 23 is buried at a position of a certain depth from the upper surface of the first well region 22. The circuit side buried layer 23 is located below the first terminal region 25a and the second terminal region 25b. The peak concentration of the circuit side buried layer 23 is higher than the peak concentration of the first well region 22. In the semiconductor integrated circuit according to the embodiment of the present invention, the circuit side buried layer 23 has substantially the same impurity concentration as that of the output side buried layer 14 on the output unit 100 side and is provided at substantially the same depth. The circuit side buried layer 23 can be formed in the same process as the output side buried layer 14 on the output unit 100 side, and thus, it is possible to suppress an increase in the number of processes.

A planar first control electrode structure (27, 28) extends in the lateral direction on the first well region 22. The first control electrode structure (27, 28) includes a gate insulating film 27 stacked on the first well region 22 between the first terminal region 25a and the second terminal region 25b and a control electrode (gate electrode) 28 stacked on the gate insulating film 27.

As the gate insulating film 27, the same material as that of the gate insulating film 18 can be used, and for example, an $SiO_2$ film or the like can be used. The gate electrode 28 electrostatically controls the surface potential of the first well region 22 through the gate insulating film 27 to form an inversion channel in the surface layer of the first well region 22. As the material of the gate electrode 29, the same material as that of the gate electrodes 19a and 19b can be used, and for example, DOPOS or the like can be used.

A first circuit terminal wiring (source electrode wiring) 31 made of a metal material such as Al is stacked on the first terminal region 25a. A second circuit terminal wiring (drain electrode wiring) 32 made of a metal material such as Al is stacked on the second terminal region 25b.

The second circuit element 202 is provided in an upper portion of the first well region 22 and is provided in a well region (second well region) 24 having a first conductivity type (n-type) having a concentration higher than that of the support layer 12. In the second circuit element 202, a third terminal region (source region) 26a having a second conductivity type ($p^+$-type) and a fourth terminal region (drain region) 26b having a second conductivity type ($p^+$-type) are formed to face each other in an upper portion of the second well region 24. The third terminal region 26a and the fourth terminal region 26b are $p^+$-type semiconductor regions which are selectively provided to be separated from each other in the upper portion of the second well region 24 and have a concentration higher than that of the first well region 22.

In the second circuit element 202, a p-n-p junction structure is configured with a triple diffusion structure of a p-type first well region 22, an n-type second well region 24, and $p^+$-type third and fourth terminal regions 26a and 26b in an upper portion of the support layer 12. Due to the p-n-p junction structure, the second well region 24 which is a back gate region of the second circuit element 202 is electrically insulated from the support layer 12 to be used at a floating potential.

A planar second control electrode structure (27, 29) is stacked on the second well region 24. The second control electrode structure (27, 29) includes a gate insulating film 27 stacked on the second well region 24 between the third terminal region 26a and the fourth terminal region 26b and a control electrode (gate electrode) 29 stacked on the gate insulating film 27. The gate electrode 29 electrostatically controls the surface potential of the second well region 24 through the gate insulating film 27 to form an inversion channel in the surface layer of the second well region 24.

A third circuit terminal wiring (source electrode wiring) 33 made of a metal material such as Al is stacked on the third terminal region 26a. A fourth circuit terminal wiring (drain electrode wiring) 34 made of a metal material such as Al is stacked on the fourth terminal region 26b. A field oxide film 30 is selectively provided between the first circuit element 201, the second circuit element 202, and the output stage element (101, 102) on the upper surface of the support layer 12.

Figure 2:
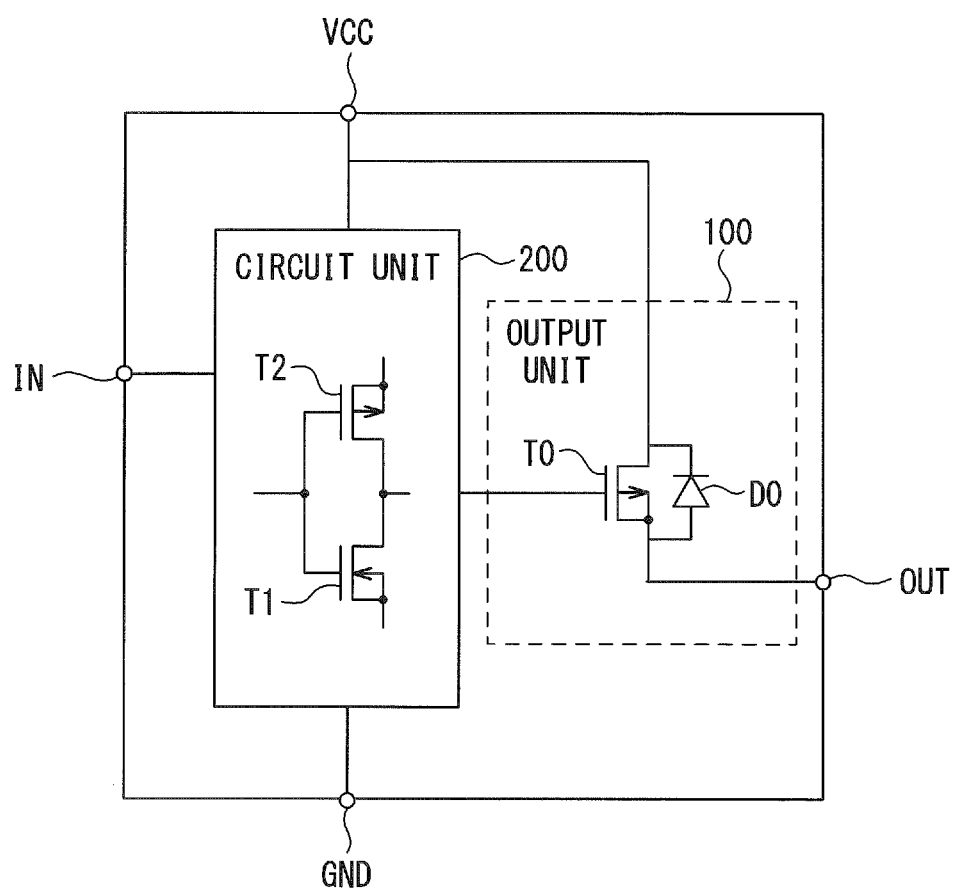
FIG. 2 is an equivalent circuit diagram illustrating the example of the semiconductor integrated circuit according to the embodiment of the present invention.

FIG. 2 illustrates an equivalent circuit diagram of a semiconductor integrated circuit according to the embodiment of the present invention. From FIG. 2, it can also be understood that the semiconductor integrated circuit according to the embodiment of the present invention includes the output unit 100 and the circuit unit 200. The first circuit element 201 and the second circuit element 202 illustrated in FIG. 1 correspond to MOS transistors T1 and T2 included in the circuit unit 200 illustrated in FIG. 2. The MOS transistors T1 and T2 correspond to, for example, a portion of a control circuit for controlling the output unit 100. The output stage element (101, 102) illustrated in FIG. 1 corresponds to the MOS transistor T0 of the output unit 100 illustrated in FIG. 2. A freewheeling diode D0 is connected to the MOS transistor T0. A source terminal of the MOS transistor T0 is connected to an output terminal OUT, and a drain terminal of the MOS transistor T0 is connected to a power supply voltage terminal VCC.

Figure 3A:
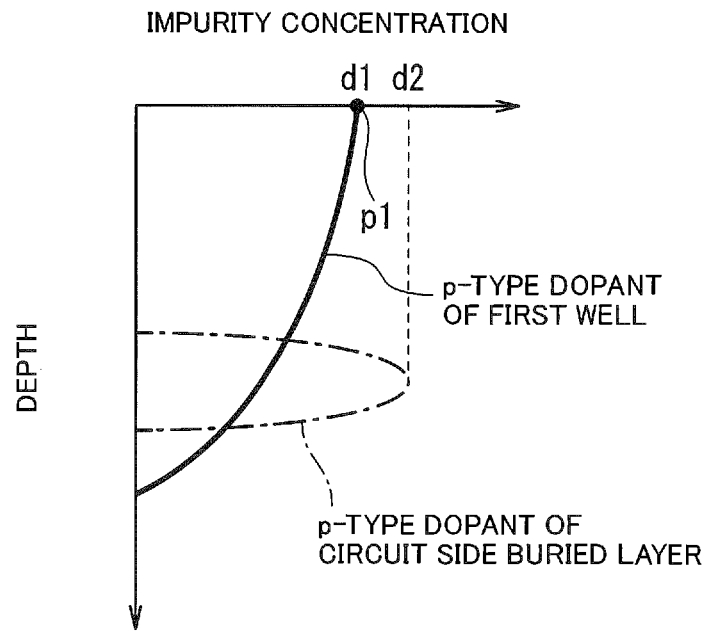
FIG. 3A is a graph illustrating an impurity concentration distribution in a depth direction from a surface of a lateral semiconductor element implementing a circuit element according to the embodiment of the present invention.

FIG. 3A illustrates the impurity concentration distribution of the p-type dopant of the first well region 22 and the p-type dopant of the circuit side buried layer 23 in the depth direction from the upper surface of the first well region 22 along line A-A in FIG. 1. The impurity concentration of the p-type dopant of the first well region 22 at a position P1 on line A-A in FIG. 1 corresponds to a plot p1 in FIG. 3A. As illustrated in FIG. 3A, the p-type dopant of the first well region 22 has a concentration distribution where the concentration has a peak concentration d1 on the upper surface side of the first well region 22 and gradually decreases along the depth direction. A peak concentration d2 of the p-type dopant of the circuit side buried layer 23 is higher than the peak concentration d1 of the p-type dopant of the first well region 22.

Figure 3B:
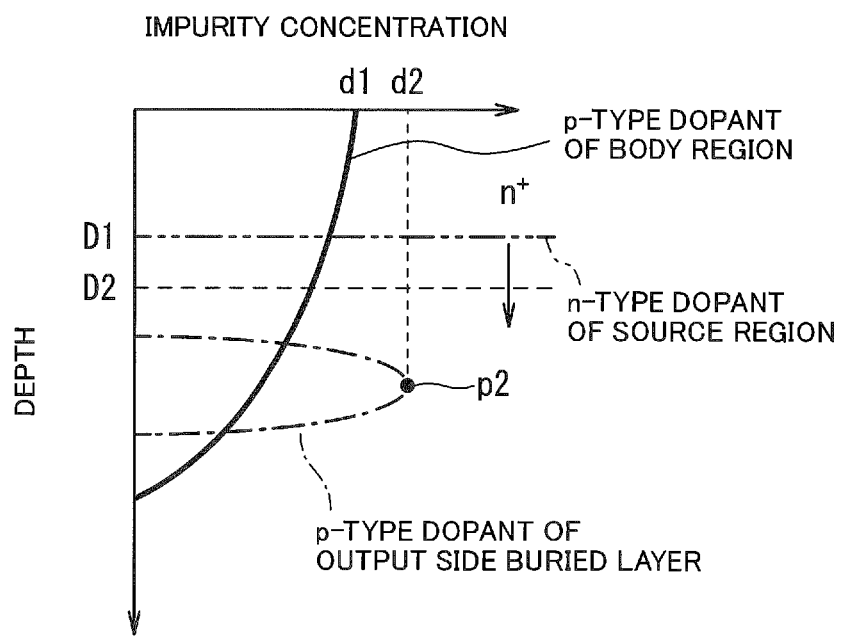
FIG. 3B is a graph illustrating an impurity concentration distribution in a depth direction from a surface of a vertical semiconductor element implementing an output stage element according to the embodiment of the present invention.

FIG. 3B illustrates the impurity concentration distribution of the n-type dopant of the first main-electrode region 15a, the p-type dopant of the body region 13b, and the p-type dopant of the output side buried layer 14 in the depth direction from the upper surface of the first main-electrode region 15a along line B-B in FIG. 1. The impurity concentration of the p-type dopant of the output side buried layer 14 at a position P2 on line B-B in FIG. 1 corresponds to a plot p2 of FIG. 3B. As illustrated in FIG. 3B, the concentration distribution of the p-type dopant of the body region 13b is equivalent to that of the p-type dopant of the first well region 22 illustrated in FIG. 3A. The p-type dopant of the body region 13b has a concentration distribution where the concentration has a peak concentration d1 on the upper surface side of the first main-electrode region 15a and gradually decreases along the depth direction. The concentration distribution of the p-type dopant of the output side buried layer 14 illustrated in FIG. 3B is equivalent to that of the p-type dopant of the circuit side buried layer 23 illustrated in FIG. 3A. The peak concentration d2 of the p-type dopant of the output side buried layer 14 is higher than the peak concentration d1 of the p-type dopant of the body region 13b.

Comparative Example

Figure 4:
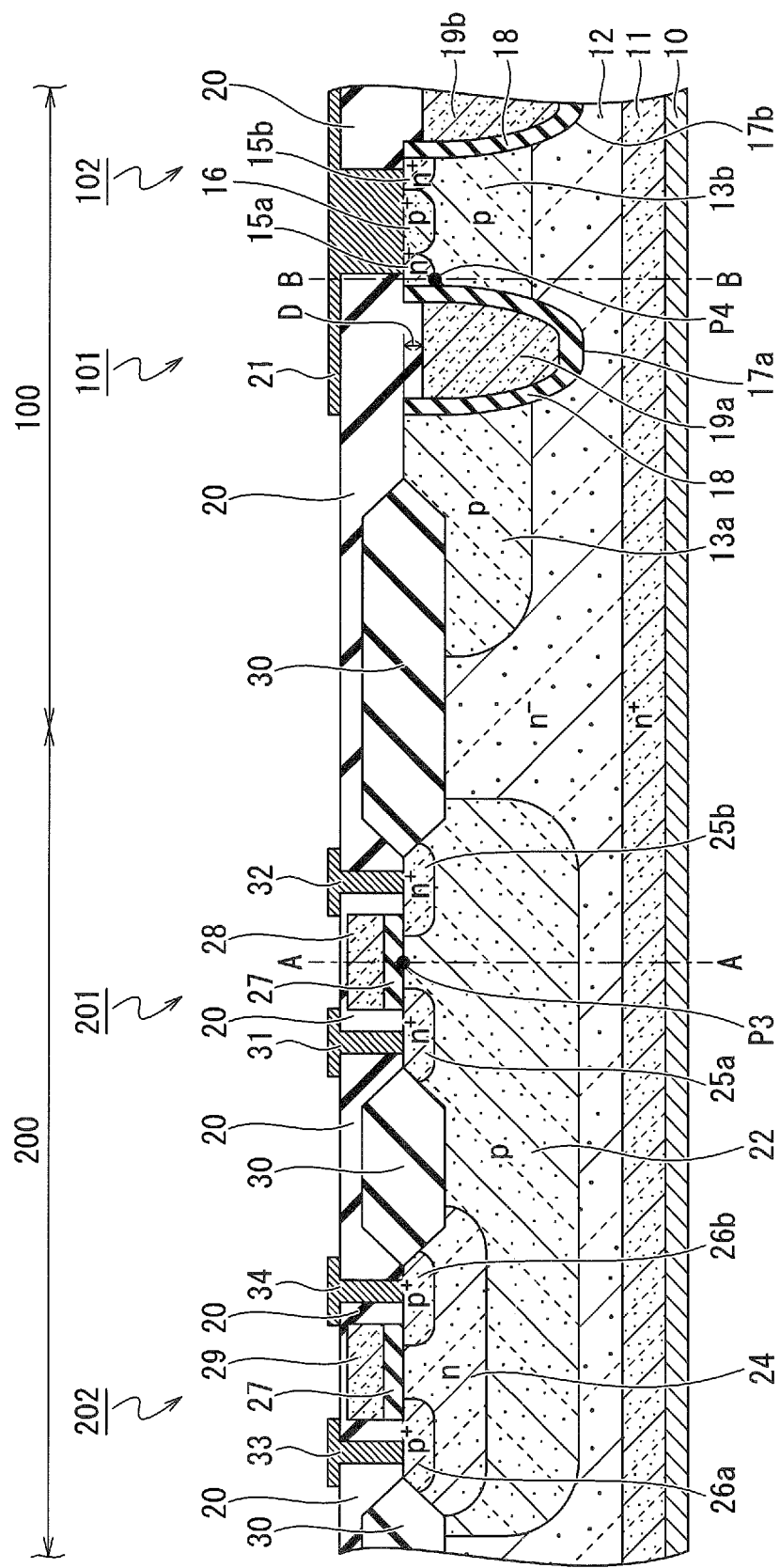
FIG. 4 is a cross-sectional view of main components illustrating a semiconductor integrated circuit according to Comparative Example.

Herein, a semiconductor integrated circuit according to Comparative Example will be described. The semiconductor integrated circuit according to Comparative Example, as illustrated in FIG. 4 is different from the semiconductor integrated circuit illustrated in FIG. 1 in that, in the output unit 100, there is no p$^+$-type output side buried layer 14 inside the body region 13b and there is no circuit side buried layer 23 inside the first well region 22 in the circuit unit 200. In addition, the semiconductor integrated circuit according to Comparative Example is different from the semiconductor integrated circuit illustrated in FIG. 1 in that the first well region 22 on the circuit unit 200 side is formed to be deeper than the body regions 13a and 13b on the output unit 100 side. The depth of the first well region 22 is larger than the depth of the gate trenches 17a and 17b. In addition, the impurity concentration of the first well region 22 is lower than the impurity concentration of the body regions 13a and 13b.

That is, in the semiconductor integrated circuit according to Comparative Example illustrated in FIG. 4, since the characteristics required for the output stage element (101, 102) and the characteristics required for the first circuit element 201 and the second circuit element 202 for controlling the output stage element are different, the first well region 22 and the body regions 13a and 13b are individually adjusted so as to have optimal concentrations and diffusion depths, respectively. It is preferable that the first circuit element 201 and the second circuit element 202 for controlling the output stage elements (101, 102) operate at a lower voltage than the output stage elements (101, 102). For this reason, the peak concentration of the first well region 22 is set to be lower than the peak concentration of the body regions 13a and 13b so that the threshold voltages of the first circuit element 201 and the second circuit element 202 are lowered. In addition to the requirement of the general characteristics of the MOSFET, the first circuit element 201 and the second circuit element 202 are required to have a predetermined breakdown voltage or more with respect to the parasitic structure formed in the vertical direction. For this reason, the total impurity amount of the first well region 22 is set in consideration of the characteristics of the parasitic structure.

Figure 5A:
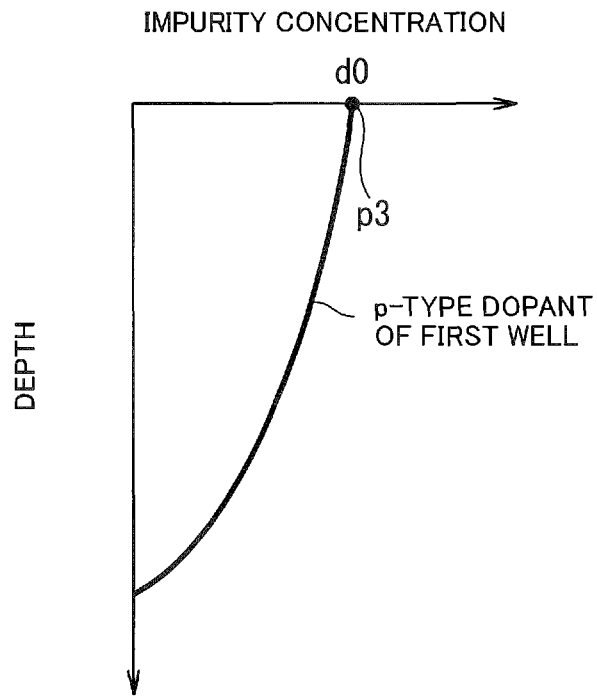
FIG. 5A is a graph illustrating an impurity concentration distribution in a depth direction from a surface of a circuit element according to Comparative Example.

FIG. 5A illustrates the impurity concentration distribution of the p-type dopant of the first well region 22 in the depth direction from the upper surface of the first well region 22 along line A-A in FIG. 4. The impurity concentration of the p-type dopant of the first well region 22 at a position P3 on line A-A in FIG. 4 corresponds to a plot p3 in FIG. 5A. As illustrated in FIG. 5A, the p-type dopant of the first well region 22 has a concentration distribution where the concentration has a peak concentration d0 on the upper surface side of the first well region 22 and gradually decreases along the depth direction.

Figure 5B:
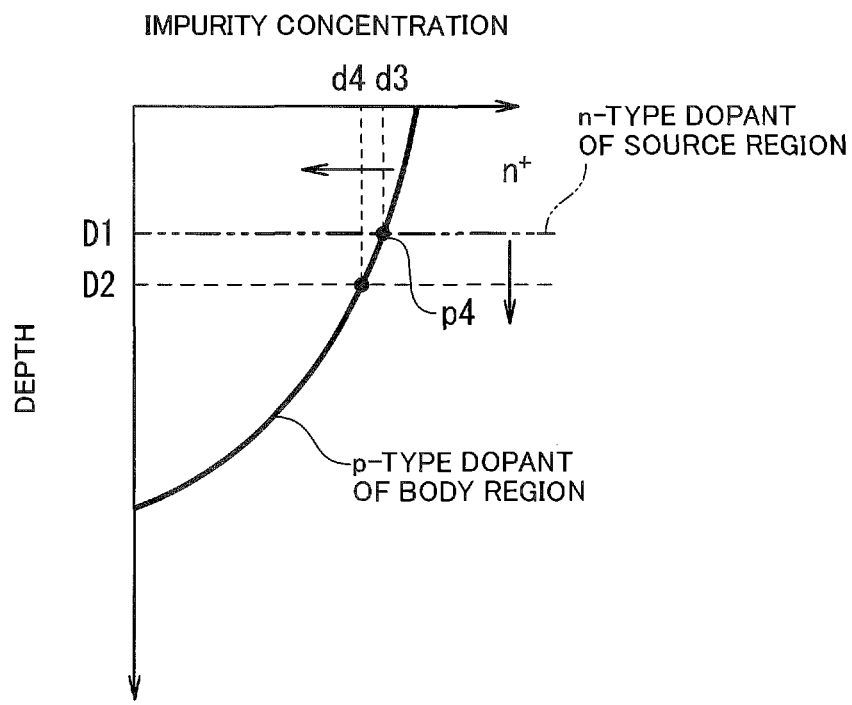
FIG. 5B is a graph illustrating an impurity concentration distribution in a depth direction from a surface of an output stage element according to Comparative Example.

FIG. 5B illustrates the impurity concentration distribution of the n-type dopant of the first main-electrode region 15a and the p-type dopant of the body region 13b in the depth direction from the upper surface of the first main-electrode region 15a along line B-B in FIG. 4. The impurity concentration of the p-type dopant at a position P4 on line B-B in FIG. 4 corresponds to a plot p4 in FIG. 5B. As illustrated in FIG. 5B, the p-type dopant of the body region 13b has a concentration distribution where the concentration has a peak concentration on the upper surface side of the first main-electrode region 15a and gradually decreases along the depth direction.

Herein, as a problem of the output unit 100 side of the semiconductor integrated circuit according to Comparative Example, due to the dropping amount D of the gate electrode 19a, for example, if a formation position (diffusion depth) D1 of an n-type dopant of the first main-electrode region 15a illustrated in FIG. 5B is changed to a deep formation position (diffusion depth) D2 in the arrow direction, the peak concentration of the channel formation portion at the location along the gate trench 17a is changed from a concentration d3 of the p-type dopant of the body region 13b to a concentration d4. For this reason, the threshold voltage of the output stage element (101, 102) changes, and as a result, a variation in the threshold voltage of the output stage elements (101, 102) occurs.

On the contrary, according to the semiconductor integrated circuit according to the embodiment of the present invention, as illustrated in FIG. 1, the output side buried layer 14 is formed at a sufficiently deep position with respect to the depth of the first main-electrode region 15a. For this reason, due to the dropping amount D of the gate electrode 19a, although the formation position (diffusion depth) D1 of the n-type dopant of the first main-electrode region 15a, for example, illustrated in FIG. 3B is changed to the deep formation position (diffusion depth) D2 in the arrow direction, the peak concentration of the channel formation portion at the location along the gate trench 17a is constant to be equal to the peak concentration d2 of the p-type dopant of the output side buried layer 14. Therefore, since the threshold voltage of the output stage element (101, 102) is not affected by the variation in the formation position (diffusion depth) of the first main-electrode region 15a, it is possible to suppress the variation in the threshold voltage of the output stage element (101, 102).

In addition, as a problem of the circuit unit 200 side of the semiconductor integrated circuit according to Comparative Example illustrated in FIG. 4, in the high side power IC, since the voltage source is connected to the back surface terminal, a high voltage is applied. In this case, in the first circuit element 201 of the circuit unit 200, there is a concern that punch-through occurs in an n-p-n junction structure configured with the n$^-$-type support layer 12, the p-type first well region 22, and the n$^+$-type first terminal region 25a and in an n-p-n junction structure configured with the n$^-$-type support layer 12, the p-type first well region 22, and the n$^+$-type second terminal region 25b. In order to prevent malfunction and destruction of the circuit unit 200, it is necessary that the punch-through immunity of these parasitic structures is equal to or higher than a predetermined value. Therefore, by forming the first well region 22 to be deep and extending the distance between the support layer 12 and the first and the second terminal regions 25a and 25b, the vertical punch-through immunity is secured. In order to form the first well region 22 to be deep, a long-time heat treatment is necessary, which becomes a factor of increasing the manufacturing cost.

On the contrary, according to the semiconductor integrated circuit of the embodiment of the present invention, as illustrated in FIG. 1, by providing the circuit side buried layer 23 inside the first well region 22 in the circuit unit 200, it is possible to secure the punch-through immunity in the n-p-n junction structure configured with the support layer 12, the first well region 22, and the first terminal region 25a and in the n-p-n junction structure configured with the support layer 12, the first well region 22, and the second terminal region 25b. For this reason, as compared with the semiconductor integrated circuit according to Comparative Example illustrated in FIG. 4, the distance between the support layer 12 and the first terminal region 25a and the second terminal region 25b can be shortened, and the first well region 22 can be formed to be shallow, so that a long-time heat treatment is unnecessary, and thus, it is possible to suppress the manufacturing cost.

In addition, in the semiconductor integrated circuit according to Comparative Example illustrated in FIG. 4, in order to reduce the cost, a case where the body regions 13a and 13b on the output unit 100 side and the first well region 22 on the circuit unit 200 side are formed in the same process with the same impurity concentration at the same depth is considered. In the output unit 100, since the DOPOS of the gate electrodes 19a and 19b drops, it is necessary to form the first main-electrode regions 15a and 15b to be deep so as to reach the gate insulating film 18 in contact with the DOPOS of the gate electrodes 19a and 19b. In order to reduce the cost, if the first main-electrode regions 15a and 15b are formed at the same time as the first terminal region 25a and the second terminal region 25b of the circuit unit 200, it is necessary to form the first well region 22 to be deep so as to prevent the punch-through. On the other hand, it is necessary to form the body regions 13a and 13b to be shallower than the gate trenches 17a and 17b. This is because, if the body regions are deeper than the gate trenches 17a and 17b, an inverted layer is not formed in lower portions of the body regions 13a and 13b and the transistor does not operate as a MOS.

Therefore, if it is attempted to form the first well region 22 and the body regions 13a and 13b in the same process with the same impurity concentration at the same depth, it is difficult to adjust the balance of the diffusion depth due to the above-described restriction. In addition, in order to realize an appropriate threshold voltage balance (threshold voltage of the circuit unit 200<threshold voltage of the output unit 100) of the output unit 100 and the circuit unit 200, it is also difficult to adjust the concentration of the first well region 22 and the body regions 13a and 13b.

On the contrary, according to the semiconductor integrated circuit of the embodiment of the present invention, the output side buried layer 14 on the output unit 100 side and the circuit side buried layer 23 on the circuit unit 200 side are formed in the same process with the same impurity concentration at the same depth. In this case, on the output unit 100 side, since the body regions 13a and 13b have a peak concentration lower than that of the output side buried layer 14, the threshold voltages of the output stage elements (101, 102) are not affected. For this reason, as compared with the semiconductor integrated circuit according to Comparative Example illustrated in FIG. 4, the impurity concentration of the body regions 13a and 13b can be lowered. On the other hand, on the circuit unit 200 side, since the punch-through immunity can be obtained by the circuit side buried layer 23, it is possible to form the first well region 22 to be shallow as compared with the semiconductor integrated circuit according to Comparative Example illustrated in FIG. 4.

Therefore, it is easy to harmonize the impurity concentration and the diffusion depth between the body regions 13a and 13b on the output unit 100 side and the first well region 22 on the circuit unit 200 side. As a result, it is possible to form the body regions 13a and 13b on the output unit 100 side and the first well region 22 on the circuit unit 200 side in the same process with the same impurity concentration at the same depth, it is possible to further suppress the manufacturing cost.

<Method of Manufacturing Semiconductor Integrated Circuit>

Next, an example of a method of manufacturing a semiconductor integrated circuit according to an embodiment of the present invention will be described with reference to FIGS. 6 to 20. In addition, the method of manufacturing a semiconductor integrated circuit described below is an example, and the semiconductor integrated circuit according to the embodiment of the present invention can be manufactured by various other methods.

Figure 6:
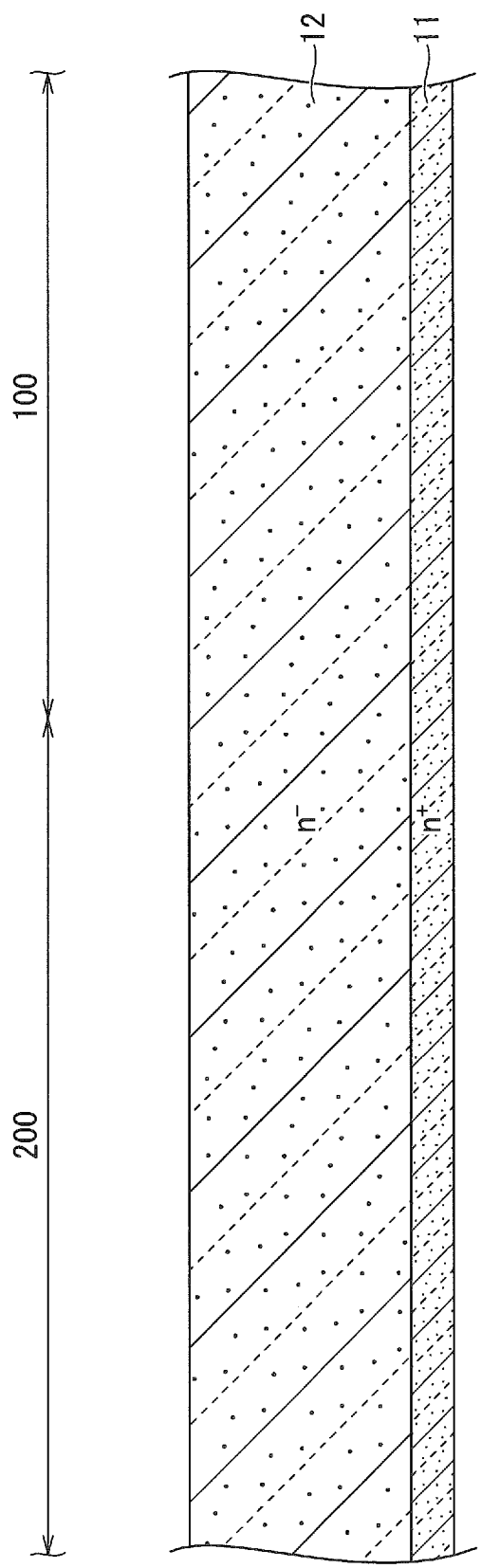
FIG. 6 is a process cross-sectional view illustrating an example of a method of manufacturing a semiconductor integrated circuit according to an embodiment of the present invention.

First, as illustrated in FIG. 6, a semiconductor substrate (Si wafer) configured with $n^+$-type silicon (Si) is prepared as a back surface contact layer 11, and an $n^-$-type support layer 12 is epitaxially grown on the back surface contact layer 11, so that a semiconductor base body (11, 12) having a double-layer structure is formed. In the case of using a semiconductor element having an output stage with a high breakdown voltage, the semiconductor base body (11, 12) may be configured by forming the back surface contact layer 11 configured with an $n^+$-type diffusion layer is formed on the back surface of the $n^-$-type semiconductor substrate (Si wafer) which is to be the support layer 12 by ion implantation or heat diffusion. In a case where the support layer 12 is configured with a semiconductor substrate, when the thickness of the semiconductor substrate causes a problem, after the thickness of the semiconductor substrate which is to be the support layer 12 is adjusted in the later stage of the process, the $n^+$-type back surface contact layer 11 may be formed by ion implantation or thermal diffusion on the back surface of the semiconductor substrate. At this time, after adhering the Si wafer on the upper surface side of the support layer 12 for the reinforcement, the thickness may be adjusted. Even in a case where the support layer 12 is epitaxially grown on the back surface contact layer 11, the thickness of the semiconductor substrate which is to be the back surface contact layer 11 may be adjusted at the later stage of the process.

Figure 7:
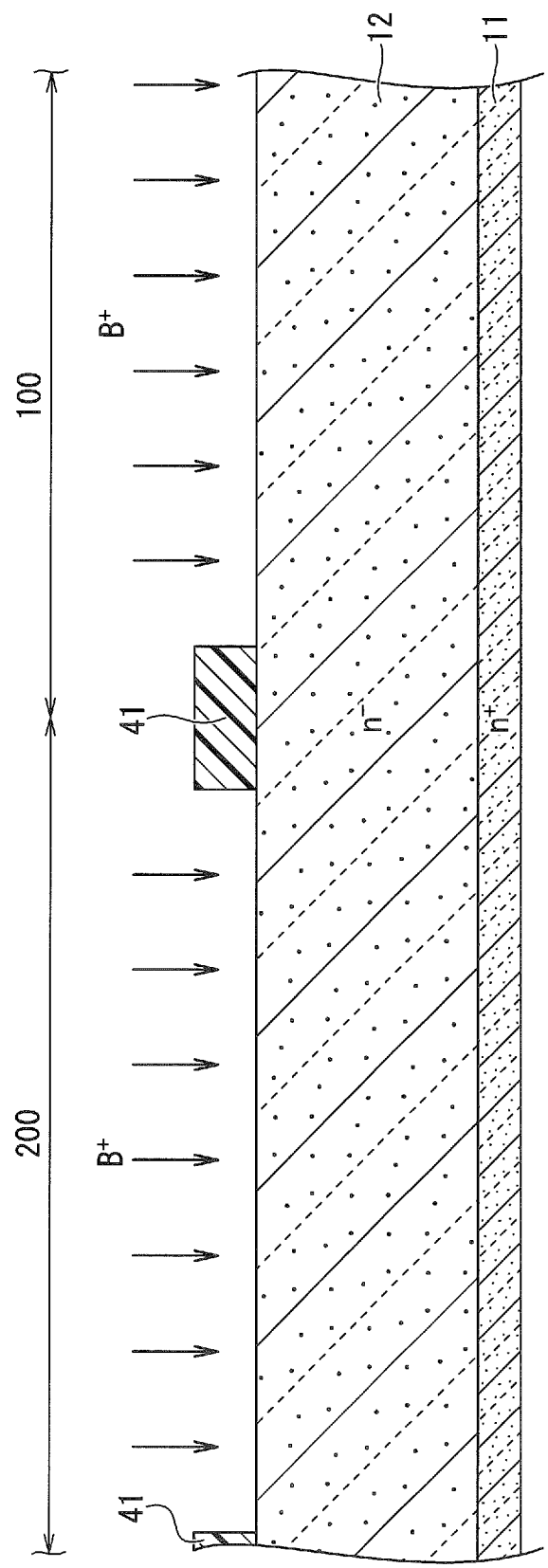
FIG. 7 is a process cross-sectional view continued from FIG. 6 illustrating the example of the method of manufacturing a semiconductor integrated circuit according to the embodiment of the present invention.
Figure 8:
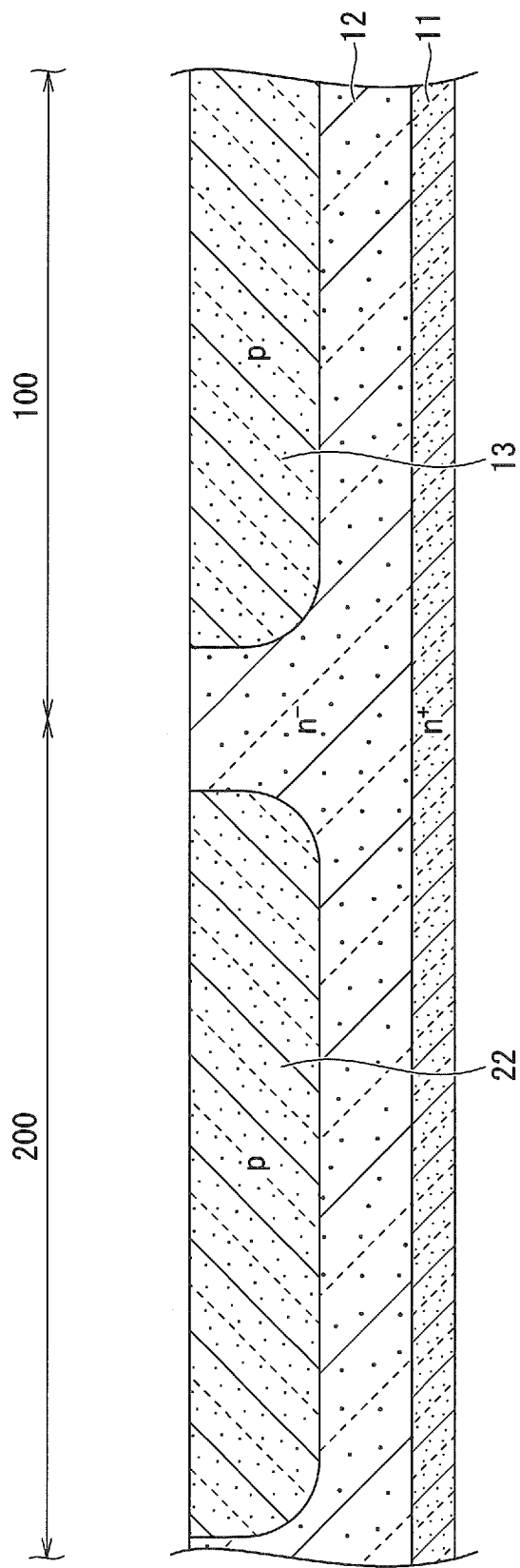
FIG. 8 is a process cross-sectional view continued from FIG. 7 illustrating the example of the method of manufacturing a semiconductor integrated circuit according to the embodiment of the present invention.

Next, a photoresist film 41 is applied on the support layer 12, and the photoresist film 41 is delineated by using a photolithography technique. By using the delineated photoresist film 41 as an ion implantation mask, as illustrated in FIG. 7, impurity ions exhibiting p-type such as boron (B) ions are selectively implanted into the upper surface of the support layer 12. Next, the photoresist film 41 used as the ion implantation mask is removed. After that, the impurity ions are activated and thermally diffused by annealing. As a result, as illustrated in FIG. 8, the p-type first well region 22 and the p-type body region (base region) 13 are simultaneously formed with the same impurity concentration at the same depth.

Figure 9:
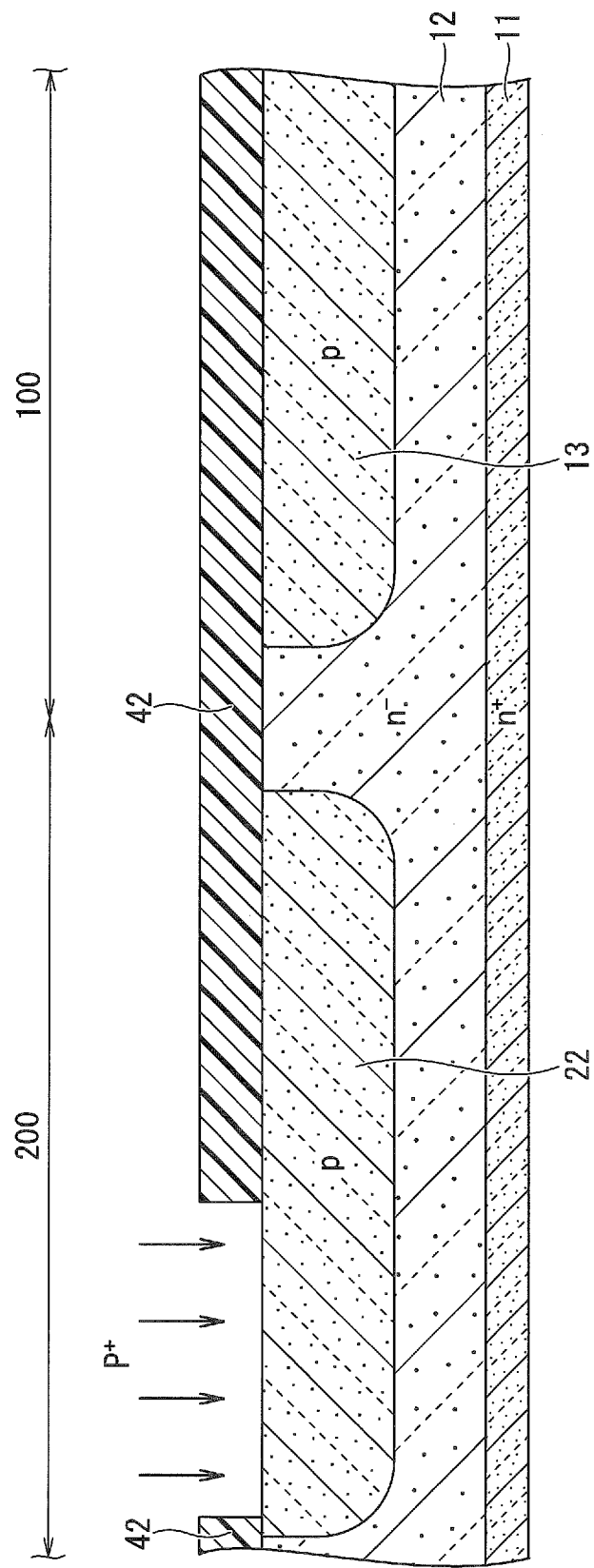
FIG. 9 is a process cross-sectional view continued from FIG. 8 illustrating the example of the method of manufacturing a semiconductor integrated circuit according to the embodiment of the present invention.
Figure 10:
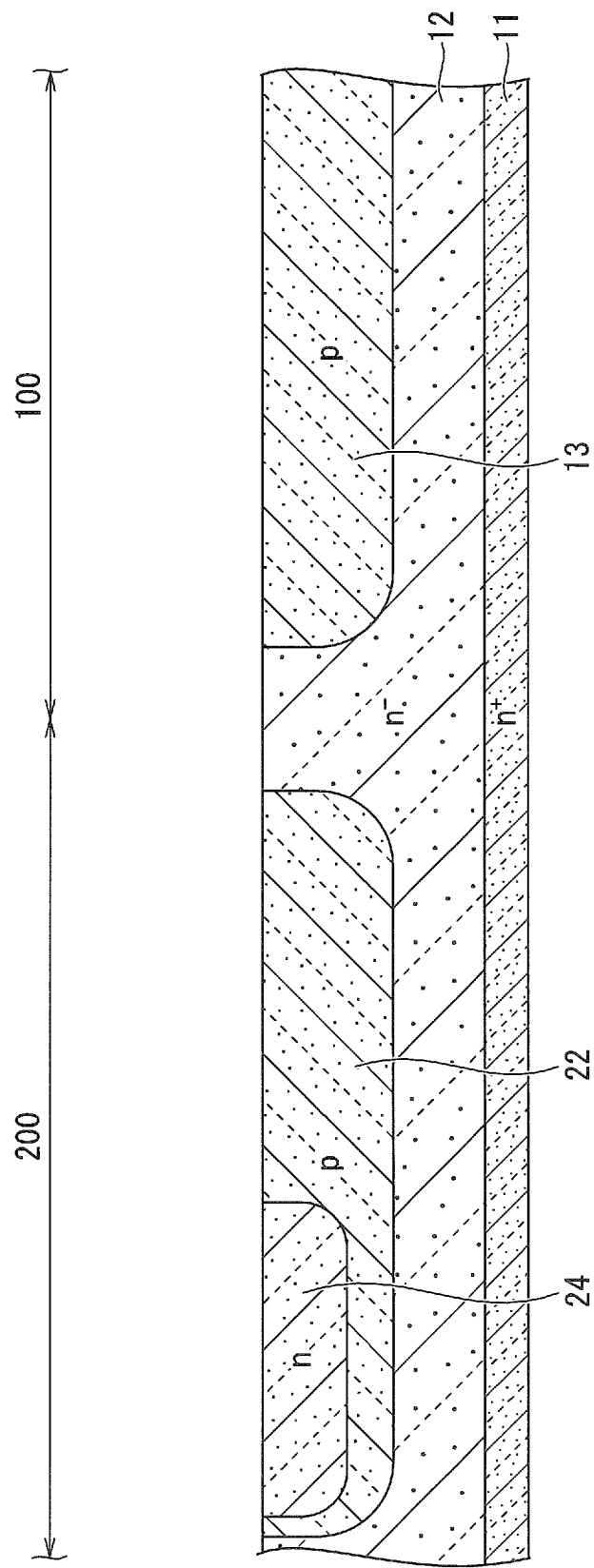
FIG. 10 is a process cross-sectional view continued from FIG. 9 illustrating the example of the method of manufacturing a semiconductor integrated circuit according to the embodiment of the present invention.

Next, a photoresist film 42 is applied on the support layer 12, the first well region 22, and the body region 13, and the photoresist film 42 is aligned with the position of the planar pattern of the first well region 22 by using a photolithography technique and is delineated inside the planar pattern of the first well region 22. As illustrated in FIG. 9, by using the delineated photoresist film 42 as an ion implantation mask, as illustrated in FIG. 9, impurity ions exhibiting n-type such as phosphorus (P) ions are selectively implanted into the upper surface of the p-type first well region 22. After that, the photoresist film 42 used as the ion implantation mask is removed, and after that, the impurity ions are activated and thermally diffused by annealing. As a result, as illustrated in FIG. 10, an n-type second well region 24 is selectively formed in an upper portion of the first well region 22.

Figure 11:
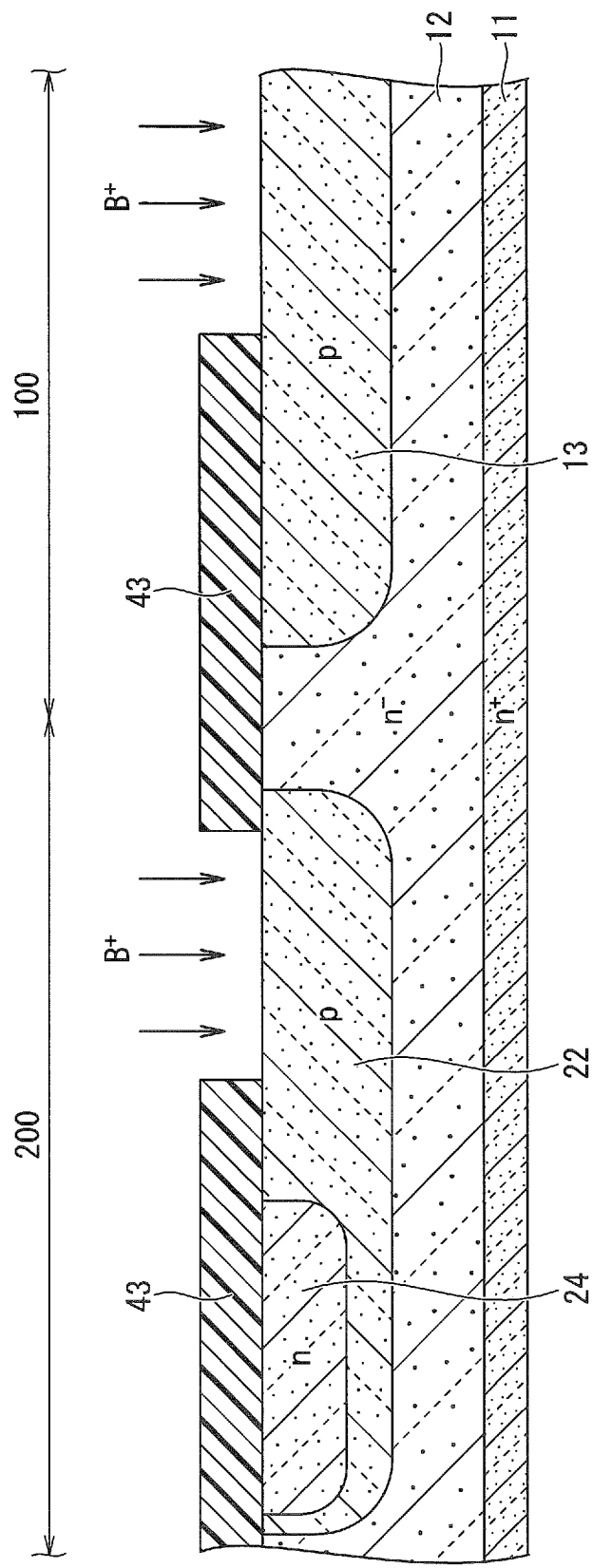
FIG. 11 is a process cross-sectional view continued from FIG. 10 illustrating the example of the method of manufacturing a semiconductor integrated circuit according to the embodiment of the present invention.
Figure 12:
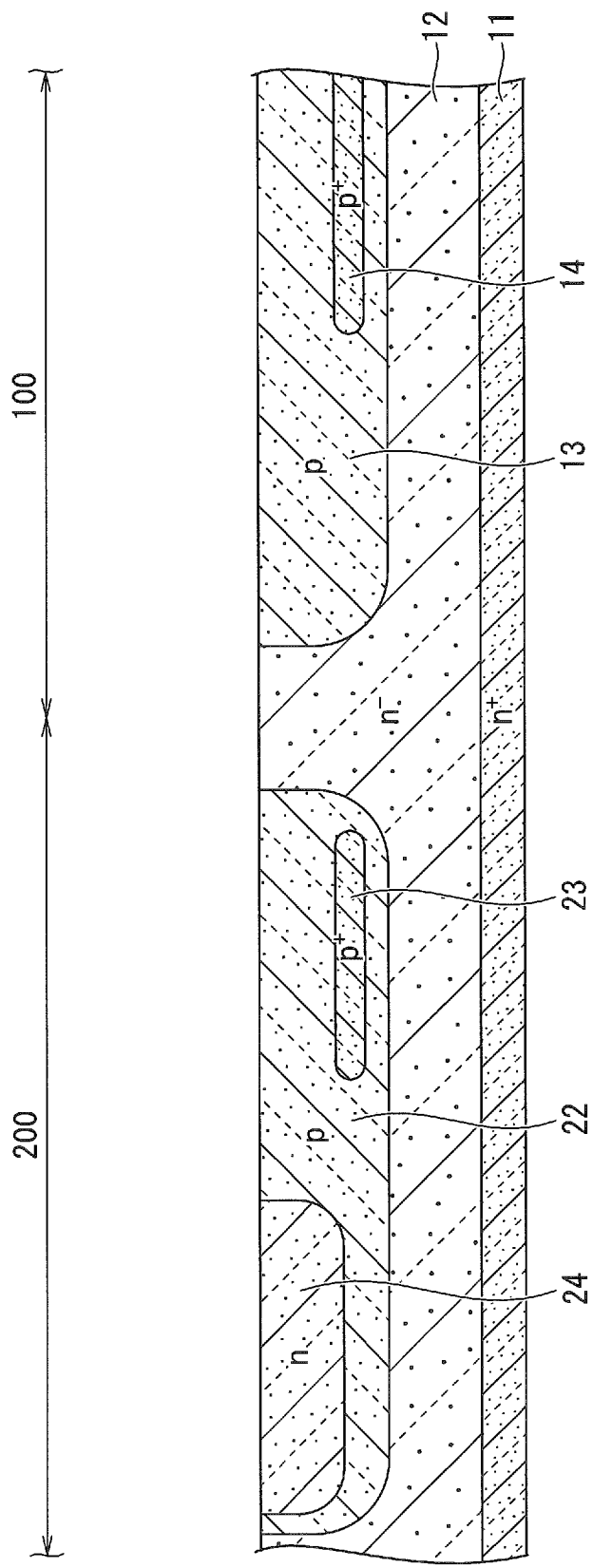
FIG. 12 is a process cross-sectional view continued from FIG. 11 illustrating the example of the method of manufacturing a semiconductor integrated circuit according to the embodiment of the present invention.

Next, a photoresist film 43 is applied on the support layer 12, the first well region 22, the second well region 24, and the body region 13, and the photoresist film 43 is delineated by using a photolithography technique. By using the delineated photoresist film 43 as an ion implantation mask, as illustrated in FIG. 11, impurity ions exhibiting p-type such as boron (B) ions and aluminum (Al) ions are selectively implanted into the upper surfaces of the first well region 22 and the body region 13. At this time, ion implantation is performed with a high acceleration voltage so that the deep position in the lower portion of the first well region 22 and the body region 13 becomes a projection range. Next, the photoresist film 43 used as the ion implantation mask is removed. After that, the impurity ions are activated by annealing, but by shortening the annealing time of the activation, it is possible to suppress the diffusion in the depth direction and form the diffusion layer with a narrow width in the depth direction. That is, as illustrated in FIG. 12, the $p^+$-type circuit side buried layer 23 and the $p^+$-type output side buried layer 14 are limitedly formed in the lower portion of the first well region 22 and in the lower portion of the body region 13, respectively, with narrow widths in the depth direction.

Figure 13:
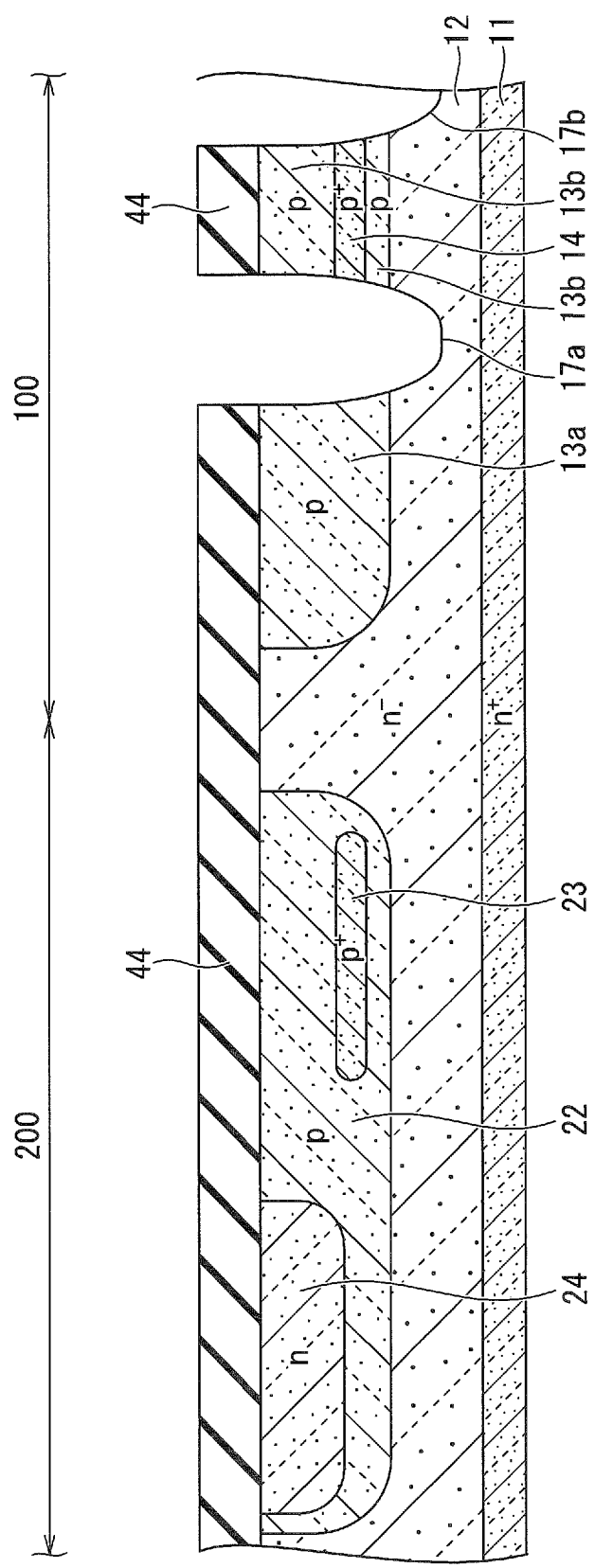
FIG. 13 is a process cross-sectional view continued from FIG. 12 illustrating the example of the method of manufacturing a semiconductor integrated circuit according to the embodiment of the present invention.

Next, a protective oxide film 44 is deposited on the support layer 12, the first well region 22, the second well region 24, and the body region 13 by a chemical vapor deposition (CVD) method or the like, and the protective oxide film 44 is delineated by using a photolithography technique. By using the delineated protective oxide film 44 as an etching mask, as illustrated in FIG. 13, by dry etching such as reactive ion etching (RIE), the gate trenches 17a and 17b are selectively dug on the upper portion of the semiconductor base body (11, 12) down to a depth penetrating through the body region 13. The body region 13 is separated into body regions 13a and 13b by the gate trench 17a. After that, the protective oxide film 44 used as the etching mask is removed.

Figure 14:
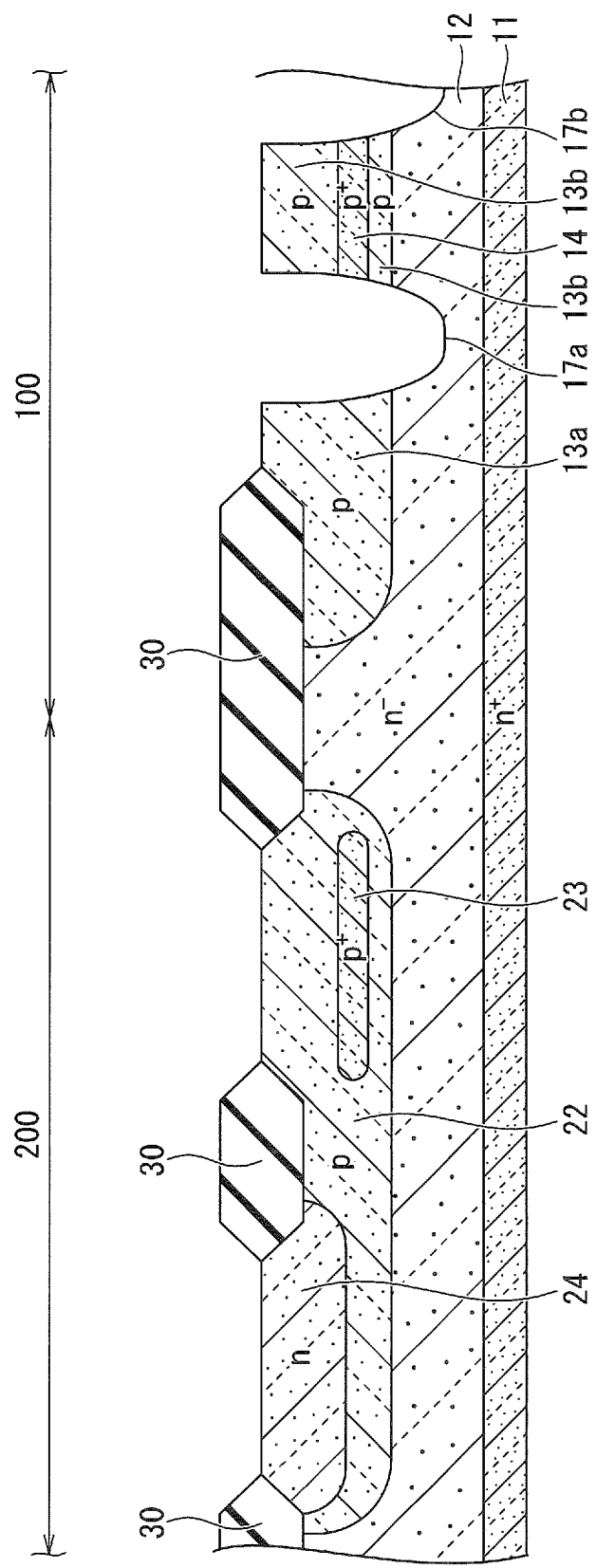
FIG. 14 is a process cross-sectional view continued from FIG. 13 illustrating the example of the method of manufacturing a semiconductor integrated circuit according to the embodiment of the present invention.

Next, a buffer oxide film is formed on the support layer 12, the first well region 22, the second well region 24, and the body regions 13a and 13b by thermal oxidation or the like, and after that, a silicon nitride film ($Si_3N_4$ film) is deposited on the buffer oxide film by a CVD method or the like. Then, a photoresist film is applied on the $Si_3N_4$ film, and the photoresist film is delineated by using a photolithography technique. By using the delineated photoresist film as an etching mask, the $Si_3N_4$ film is delineated by dry etching such as RIE or the like. By a silicon local oxidation (LOCOS) method using the patterned $Si_3N_4$ film as a non-oxidative mask, as illustrated in FIG. 14, the field oxide film 30 is selectively formed on the support layer 12, the first well region 22, the second well region 24, and the body region 13a. In the region of the second circuit element 202 of the circuit unit 200, the upper surfaces of the first well region 22 and the second well region 24 are exposed to a window portion surrounded by the field oxide film 30.

Figure 15:
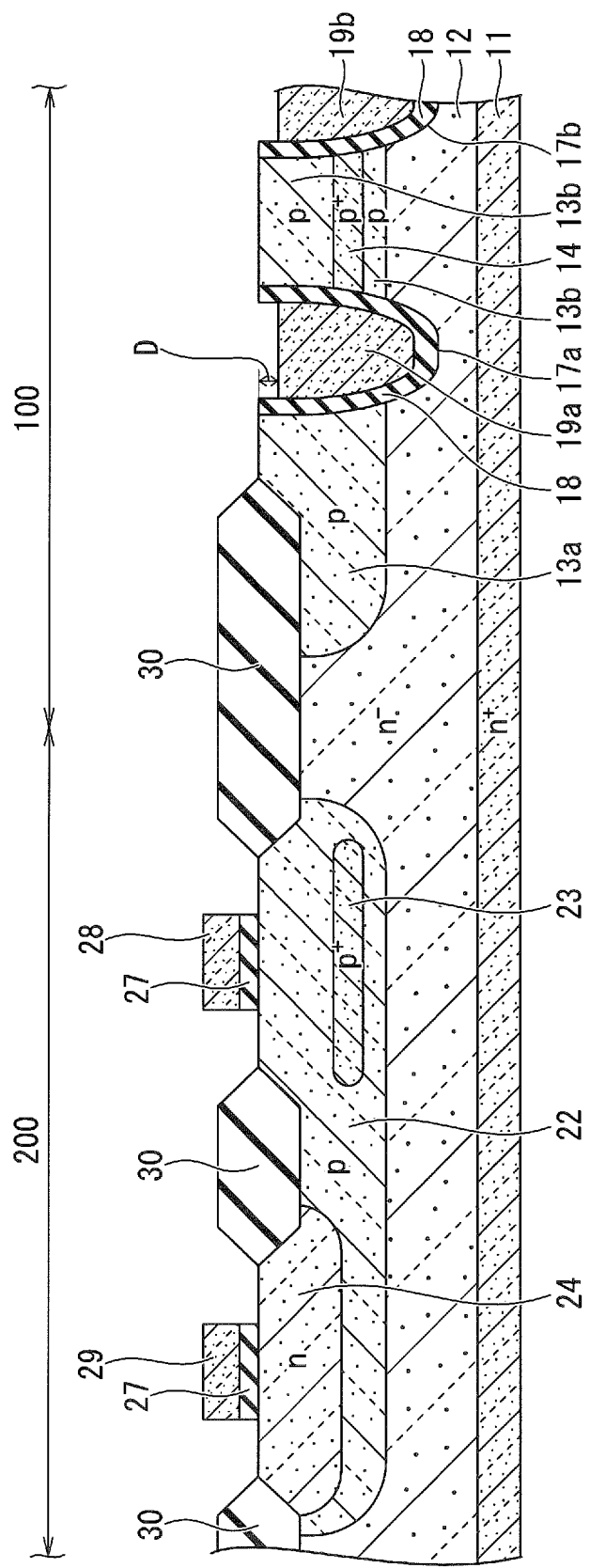
FIG. 15 is a process cross-sectional view continued from FIG. 14 illustrating the example of the method of manufacturing a semiconductor integrated circuit according to the embodiment of the present invention.

Next, a gate insulating film 27 is formed on the first well region 22 and the second well region 24 exposed between the field oxide films 30 by a thermal oxidation method, and a gate insulating film 18 is formed on the body regions 13a and 13b and on the inner wall of the gate trenches 17a and 17b. Next, a DOPOS layer is deposited on the field oxide film 30, on the gate insulating film 27, on the gate insulating film 18, and in the gate trenches 17a and 17b by a CVD method or the like. A photoresist film is applied on the DOPOS layer, and the photoresist film is delineated by using a photolithography technique. By using the delineated photoresist film as an etching mask, the DOPOS layer, the gate insulating film 27, and the gate insulating film 18 are patterned by dry etching such as RIE or the like. After that, the photoresist film used as the etching mask is removed. As a result, as illustrated in FIG. 15, a gate electrode 28, a gate electrode 29, and gate electrodes 19a and 19b configured with a DOPOS layer are formed. At this time, in order to prevent the DOPOS from remaining as an etching residue on the surface of the support layer 12, since the DOPOS layer is etched under the condition of overetching, the DOPOS layer as the gate electrodes 19a and 19b is excessively removed, so that the upper portions of the gate electrodes 19a and 19b drop below the upper ends of the gate trenches 17a and 17b.

Figure 16:
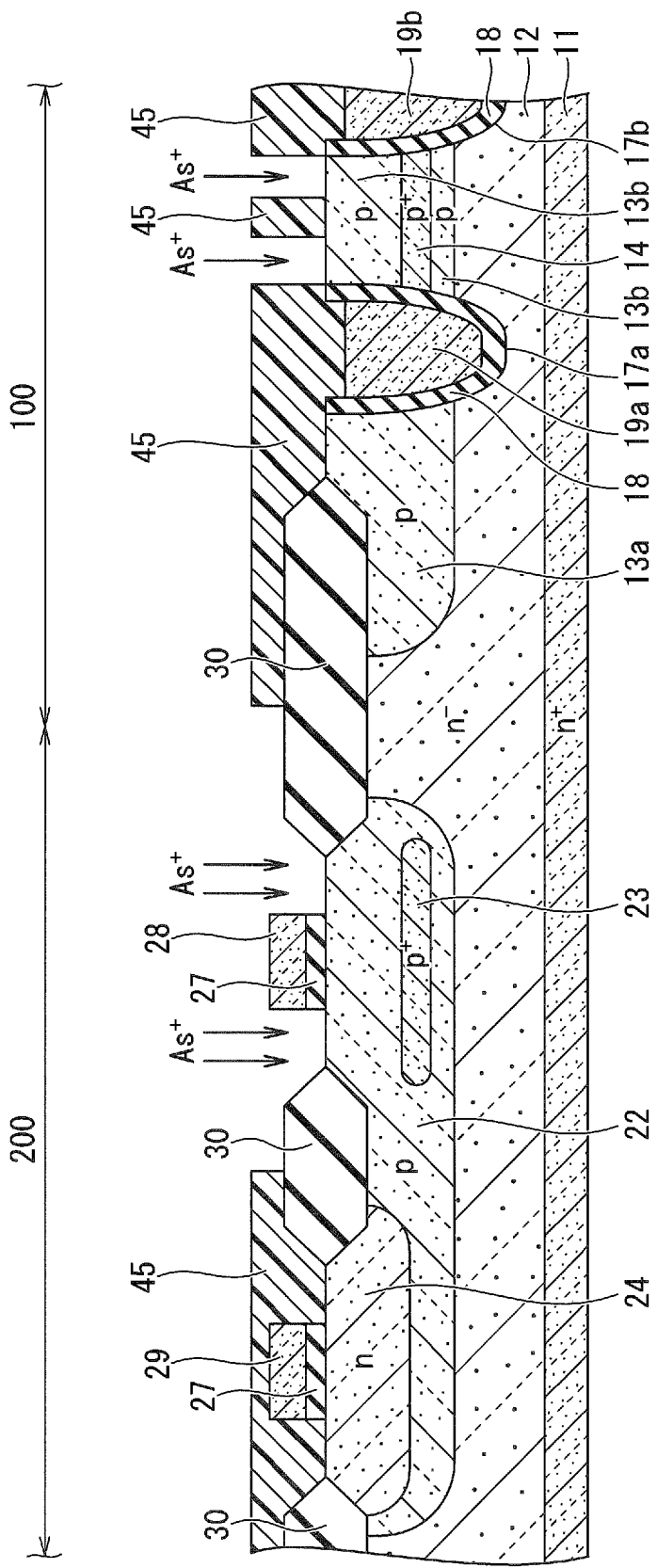
FIG. 16 is a process cross-sectional view continued from FIG. 15 illustrating the example of the method of manufacturing a semiconductor integrated circuit according to the embodiment of the present invention.

Next, as illustrated in FIG. 16, an ion implantation mask 45 having openings is formed on the body region 13b of the output stage element (101, 102) and on the first circuit element 201 region by using a photolithography technique. Then, by using the gate electrode 28 exposed to the opening of the ion implantation mask 45 as a self-alignment mask, impurity ions exhibiting n-type such as arsenic (As) ions or phosphorus (P) ions are selectively implanted into the upper surface of the body region 13b and the upper surface of the second well region 24.

Figure 17:
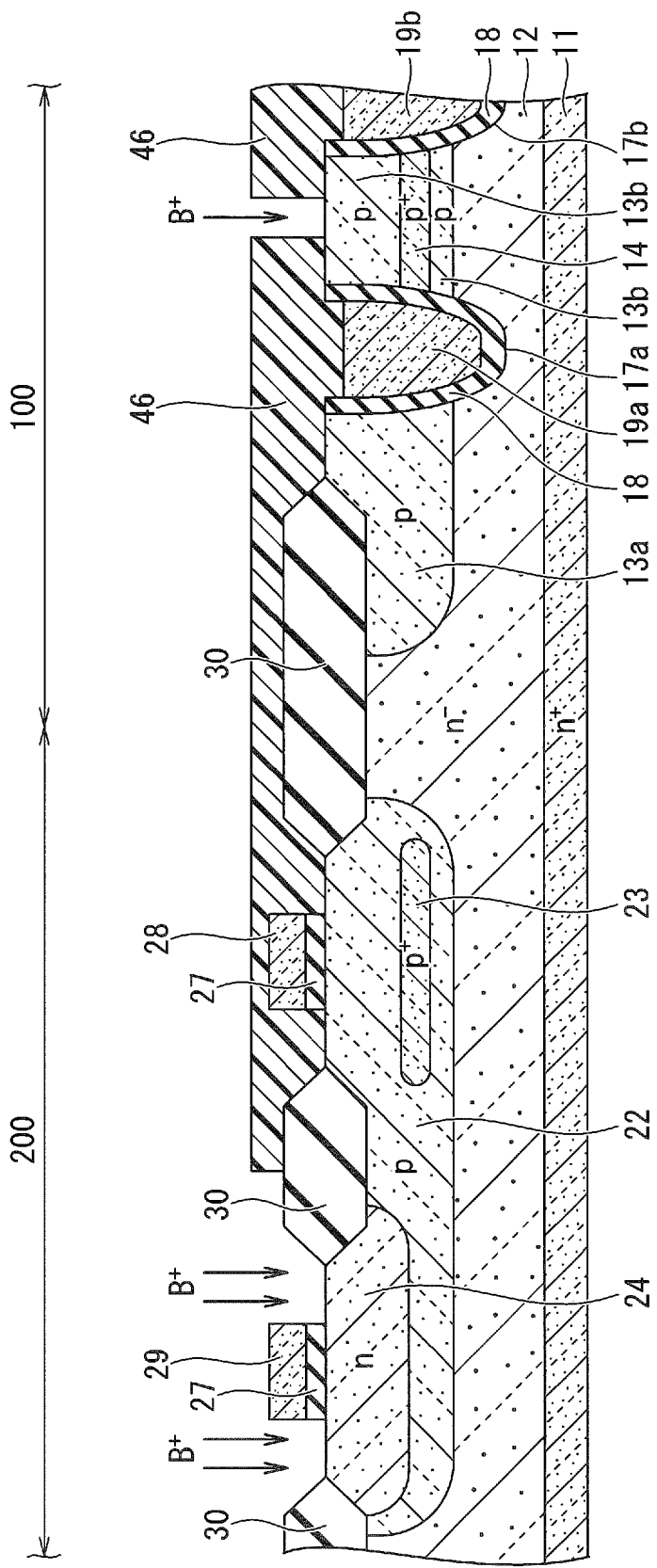
FIG. 17 is a process cross-sectional view continued from FIG. 16 illustrating the example of the method of manufacturing a semiconductor integrated circuit according to the embodiment of the present invention.
Figure 18:
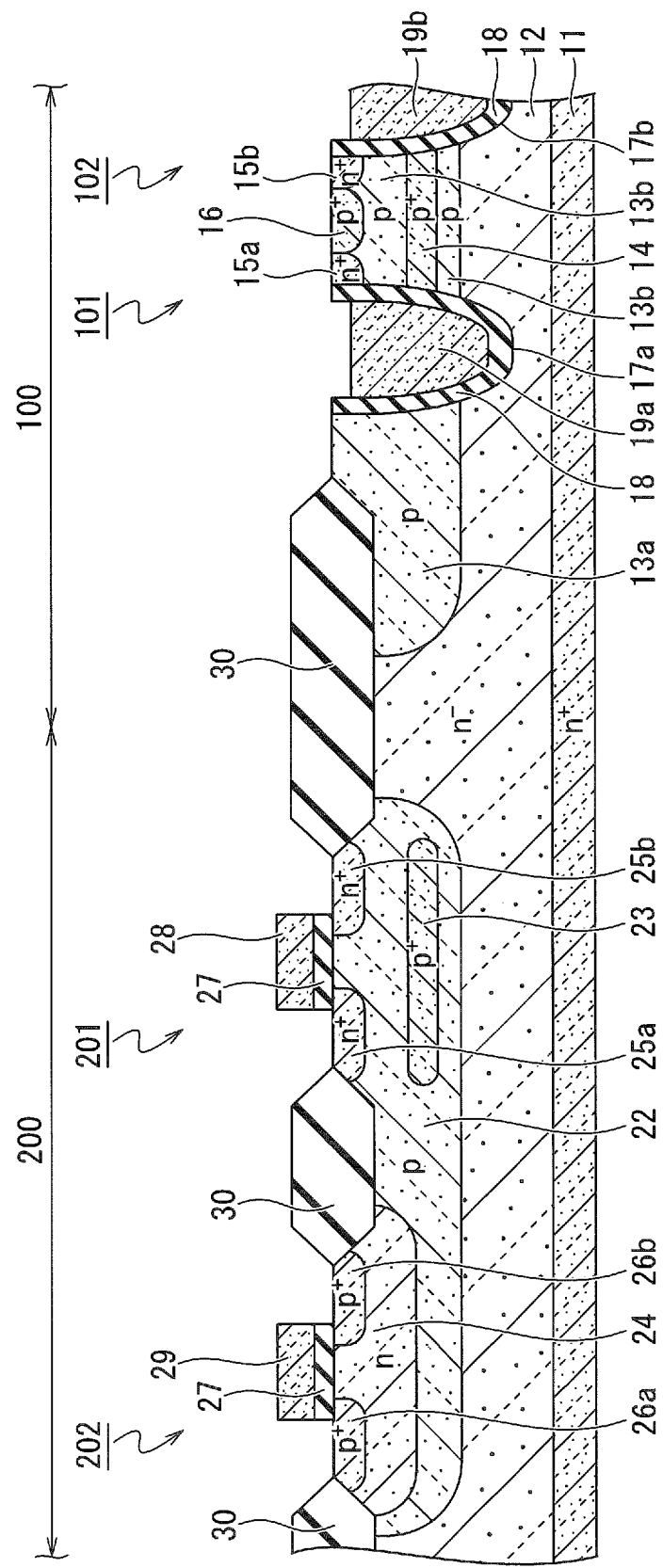
FIG. 18 is a process cross-sectional view continued from FIG. 17 illustrating the example of the method of manufacturing a semiconductor integrated circuit according to the embodiment of the present invention.

After removing the ion implantation mask 45, as illustrated in FIG. 17, an ion implantation mask 46 having openings is newly formed on the body region 13b and on the second circuit element 202 region by using a photolithography technique. Then, by using the gate electrode 29 exposed to the opening of the ion implantation mask 46 as a self-alignment mask, impurity ions exhibiting p-type such as boron (B) ions are selectively implanted into the upper surface of the body region 13b and the upper surface of the first well region 22. After removing the ion implantation mask 46, p-type and n-type impurity ions are activated and thermally diffused by annealing. As a result, as illustrated in FIG. 18, the $n^+$-type first main-electrode regions 15a and 15b and the $p^+$-type contact region 16 of the output stage element (101, 102) are formed in the output unit 100. In the circuit unit 200, the $n^+$-type first terminal region 25a and the $n^+$-type second terminal region 25b of the first circuit element 201 are formed. Furthermore, the $p^+$-type third terminal region 26a and the $p^+$-type fourth terminal region 26b of the second circuit element 202 are formed.

In addition, herein, although the first main-electrode regions 15a and 15b and the contact region 16 are formed after the gate trenches 17a and 17b are formed and buried by the DOPOS layer, the gate trenches 17a and 17b may be formed after the first main-electrode regions 15a and 15b and the contact region 16 are formed. In addition, the contact region 16, the third terminal region 26a, and the fourth terminal region 26b may be individually formed. In addition, the first main-electrode regions 15a and 15b and the first terminal region 25a and the second terminal region 25b may be individually formed.

Figure 19:
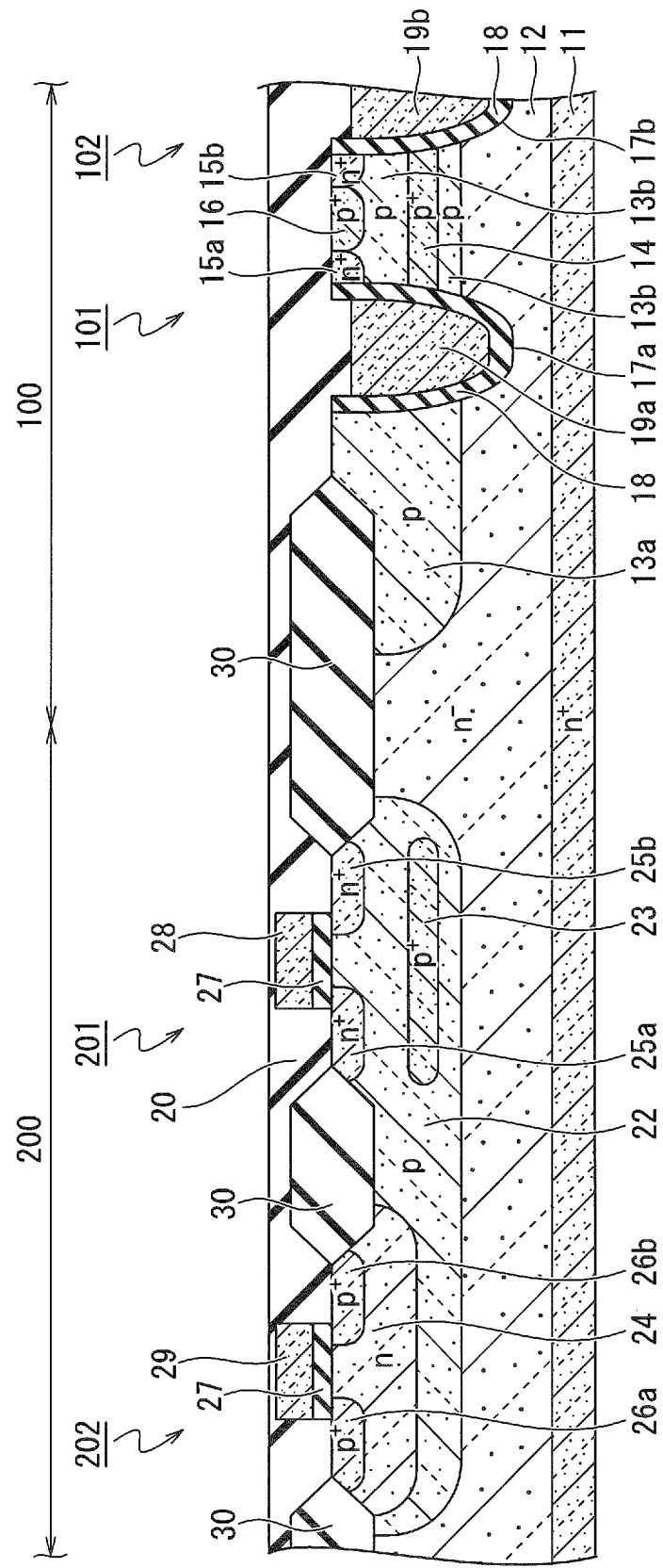
FIG. 19 is a process cross-sectional view continued from FIG. 18 illustrating the example of the method of manufacturing a semiconductor integrated circuit according to the embodiment of the present invention.

Next, as illustrated in FIG. 19, an interlayer insulating film 20 is deposited by CVD method or the like. The surface of the interlayer insulating film 20 is flattened by a technique such as chemical mechanical polishing (CMP) or the like. A photoresist film is applied on the flattened interlayer insulating film 20, and the photoresist film is delineated by using a photolithography technique. By dry etching such as RIE by using the delineated photoresist film as an etching mask, the interlayer insulating film 20 is delineated to form a contact hole.

Figure 20:
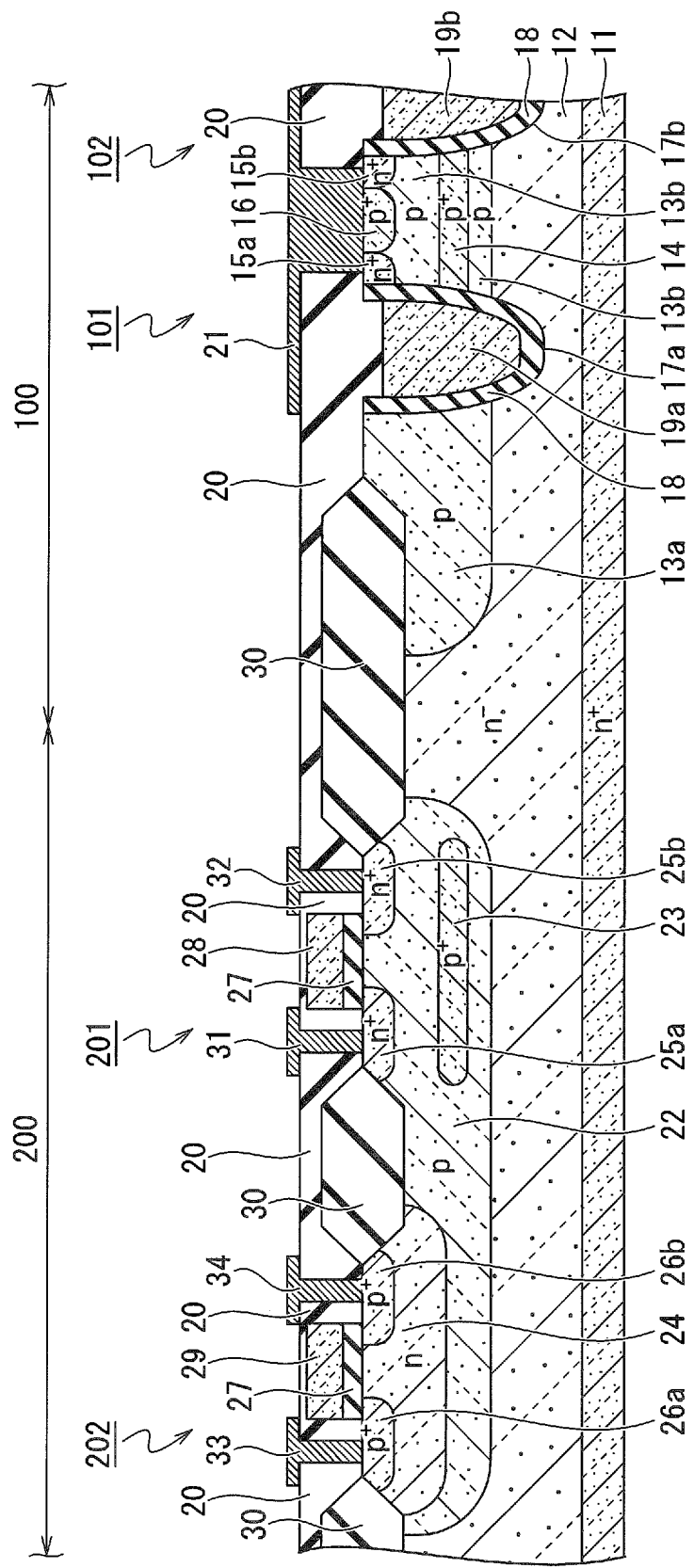
FIG. 20 is a process cross-sectional view continued from FIG. 19 illustrating the example of the method of manufacturing a semiconductor integrated circuit according to the embodiment of the present invention.

After that, a metal film of Al or the like is deposited by a sputtering method, a vapor deposition method, or the like. A photoresist film is applied on the metal film, and the photoresist film is delineated by using a photolithography technique. By using the delineated photoresist film as an etching mask, the metal film is delineated by dry etching such as RIE. As a result, as illustrated in FIG. 20, the gate electrode wiring (not illustrated), the first circuit terminal wiring 31, the second circuit terminal wiring 32, the third circuit terminal wiring 33, and the fourth circuit terminal wiring 34 are formed. In addition, in a salicide process using a silicide of a refractory metal such as W, Mo, or Ti, the gate electrode wiring (not illustrated), the first circuit terminal wiring 31, the second circuit terminal wiring 32, the third circuit terminal wiring 33, and the fourth circuit terminal wiring 34 may be formed. After that, by depositing the back surface electrode 10 made of Al or the like on the back surface of the back surface contact layer 11 by a sputtering method, a vapor deposition method, or the like, the semiconductor integrated circuit illustrated in FIG. 1 is completed.

According to the method of manufacturing the semiconductor integrated circuit according to the embodiment of the present invention, it is possible to easily realize the semiconductor integrated circuit capable of efficiently improving the characteristics of the output stage element (101, 102) which is a vertical power semiconductor element and the characteristics of the first circuit element 201 and the second circuit element 202 which are lateral semiconductor elements for controlling the output stage element by harmonizing both the characteristics.

Furthermore, by simultaneously forming the p$^+$-type circuit side buried layer 23 on the circuit unit 200 side and the p$^+$-type output side buried layer 14 on the output unit 100 side, it is possible to suppress an increase in the number of processes. In addition, by simultaneously forming the first well region 22 on the circuit unit 200 side and the body region 13 on the output unit 100 side, it is possible to suppress an increase in the number of processes. In addition, by simultaneously forming the first terminal region 25a and the second terminal region 25b on the circuit unit 200 side and the first main-electrode regions 15a and 15b on the output unit 100 side, it is possible to suppress an increase in the number of processes.

First Modified Example

Figure 21:
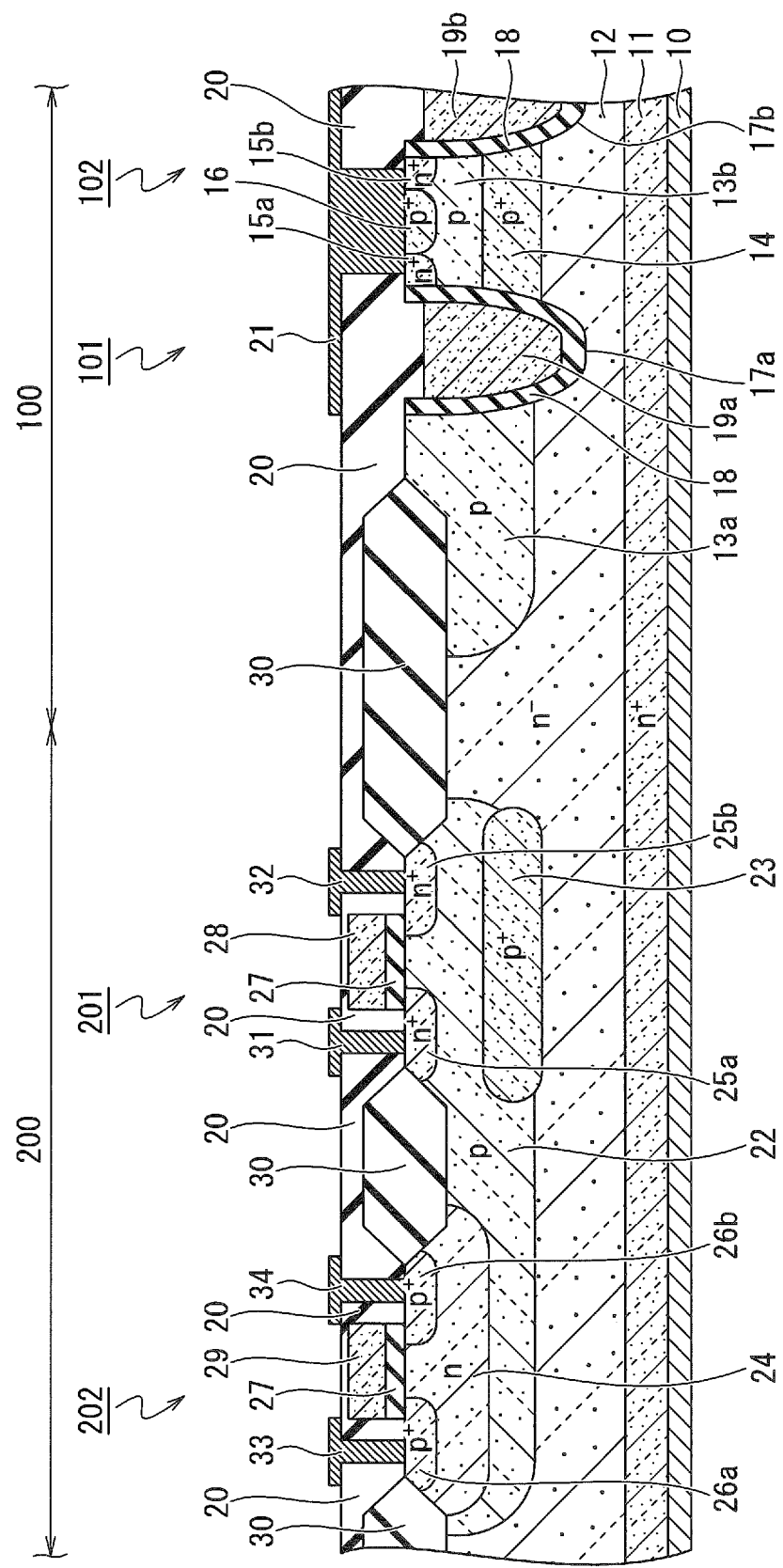
FIG. 21 is a cross-sectional view of main components illustrating an example of a semiconductor integrated circuit according to a first modified example of the embodiment of the present invention.

A semiconductor integrated circuit according to a first modified example of the embodiment of the present invention is different from the semiconductor integrated circuit according to the embodiment of the present invention illustrated in FIG. 1 in that, as illustrated in FIG. 21, the circuit side buried layer 23 buried inside the first well region 22 on the circuit unit 200 side is not completely covered with the first well region 22. A portion of the circuit side buried layer 23 is in contact with the first well region 22, and the remaining portion of the circuit side buried layer 23 is in contact with the support layer 12. In this manner, the circuit side buried layer 23 buried inside the first well region 22 may not be completely covered with the first well region 22, and a portion of the circuit side buried layer 23 may be covered with the first well region 22.

In addition, the semiconductor integrated circuit according to the first modified example is different from the semiconductor integrated circuit according to the embodiment of the present invention illustrated in FIG. 1 in that the upper surface and the lower surface of the output side buried layer 14 buried inside the body region 13b on the output unit 100 side are not interposed in the body region 13b. The upper surface of the output side buried layer 14 is in contact with the body region 13b, and the lower surface of the output side buried layer 14 is in contact with the support layer 12. The depths of the circuit side buried layer 23 and the output side buried layer 14 are smaller than the depths of the gate trenches 17a and 17b. In this manner, the upper surface and the lower surface of the output side buried layer 14 buried inside the body region 13b may not be interposed in the body region 13b, and a portion of the output side buried layer 14 may be covered with the body region 13b.

Second Modified Example

Figure 22:
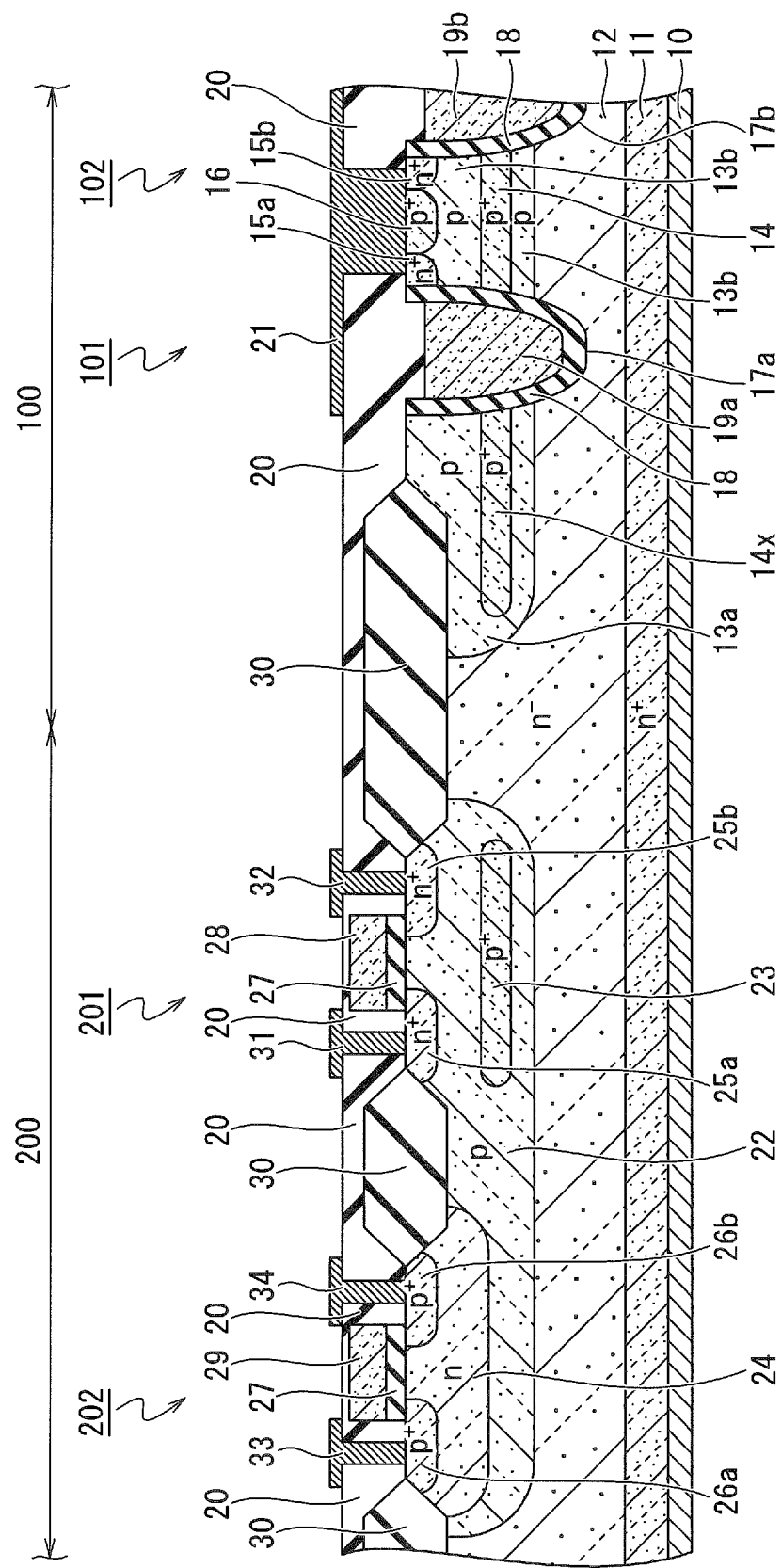
FIG. 22 is a cross-sectional view of main components illustrating an example of a semiconductor integrated circuit according to a second modified example of the embodiment of the present invention.

A semiconductor integrated circuit according to a second modified example of the embodiment of the present invention is different from the semiconductor integrated circuit according to the embodiment of the present invention illustrated in FIG. 1 in that, as illustrated in FIG. 22, the p$^+$-type output side buried layer 14x is also provided inside the body region 13a on the output unit 100 side. The output side buried layer 14x has substantially the same impurity concentration as that of the output side buried layer 14 and is provided at a depth substantially equal to that of the output side buried layer 14. During the ion implantation for forming the output side buried layer 14, by implanting ions also into the region where the output side buried layer 14x is formed, the output side buried layer 14x can be formed.

Third Modified Example

Figure 23:
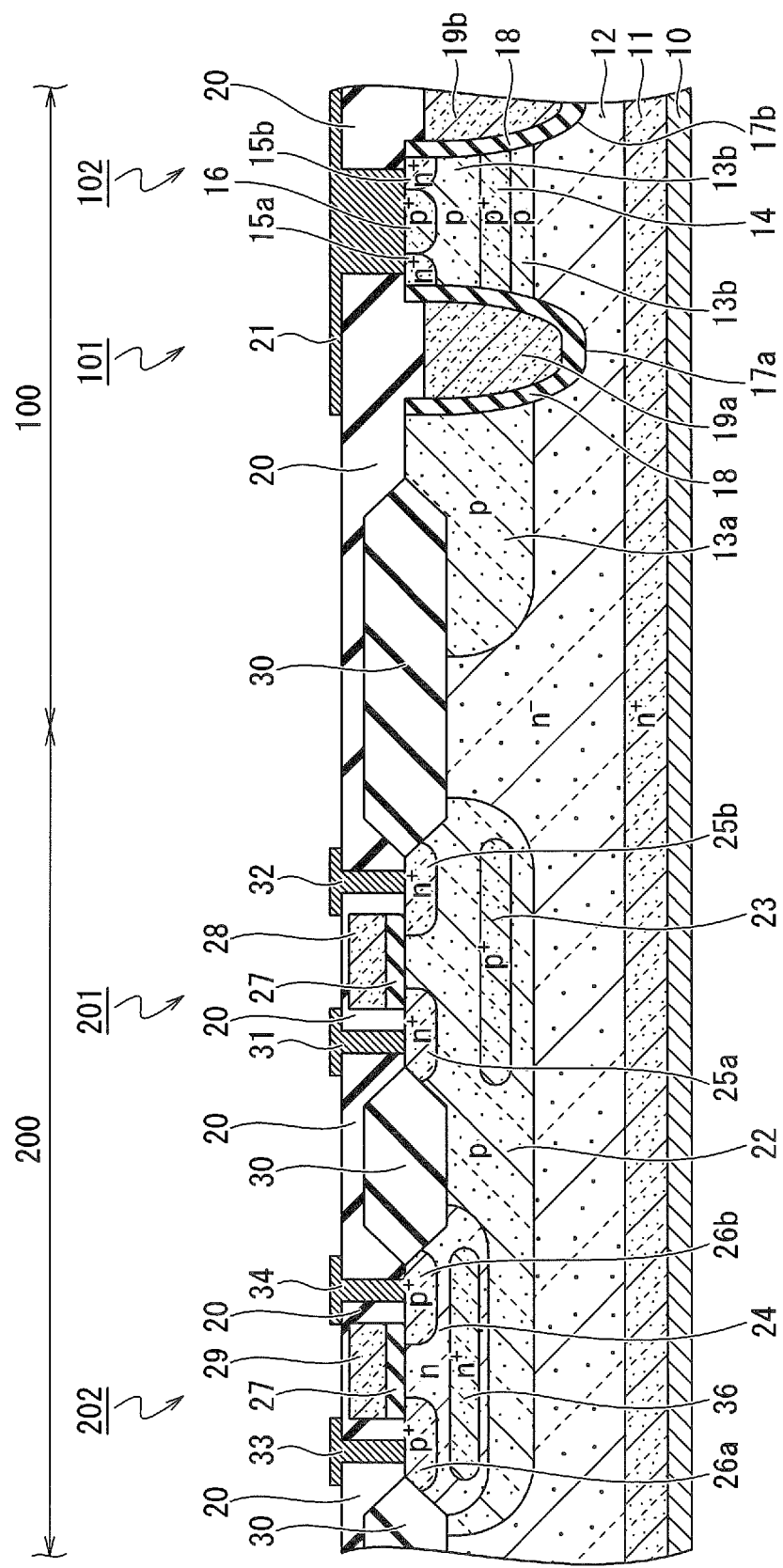
FIG. 23 is a cross-sectional view of main components illustrating an example of a semiconductor integrated circuit according to a third modified example of the embodiment of the present invention.

A semiconductor integrated circuit according to a third modified example of the embodiment of the present invention is different from the semiconductor integrated circuit according to the embodiment of the present invention illustrated in FIG. 1 in that, as illustrated in FIG. 23, an n$^+$-type circuit side buried layer 36 is provided inside the second well region 24 on the circuit unit 200 side. The circuit side buried layer 36 is located below the third terminal region 26a and the fourth terminal region 26b. By providing the circuit side buried layer 36, it is possible to secure punch-through immunity in a p-n-p junction structure configured with the p-type first well region 22, the n-type second well region 24, and the p$^+$-type third terminal region 26a and in a p-n-p junction structure configured with the p-type first well region 22, the n-type second well region 24, and the p$^+$-type fourth terminal region 26b.

Fourth Modified Example

Figure 24:
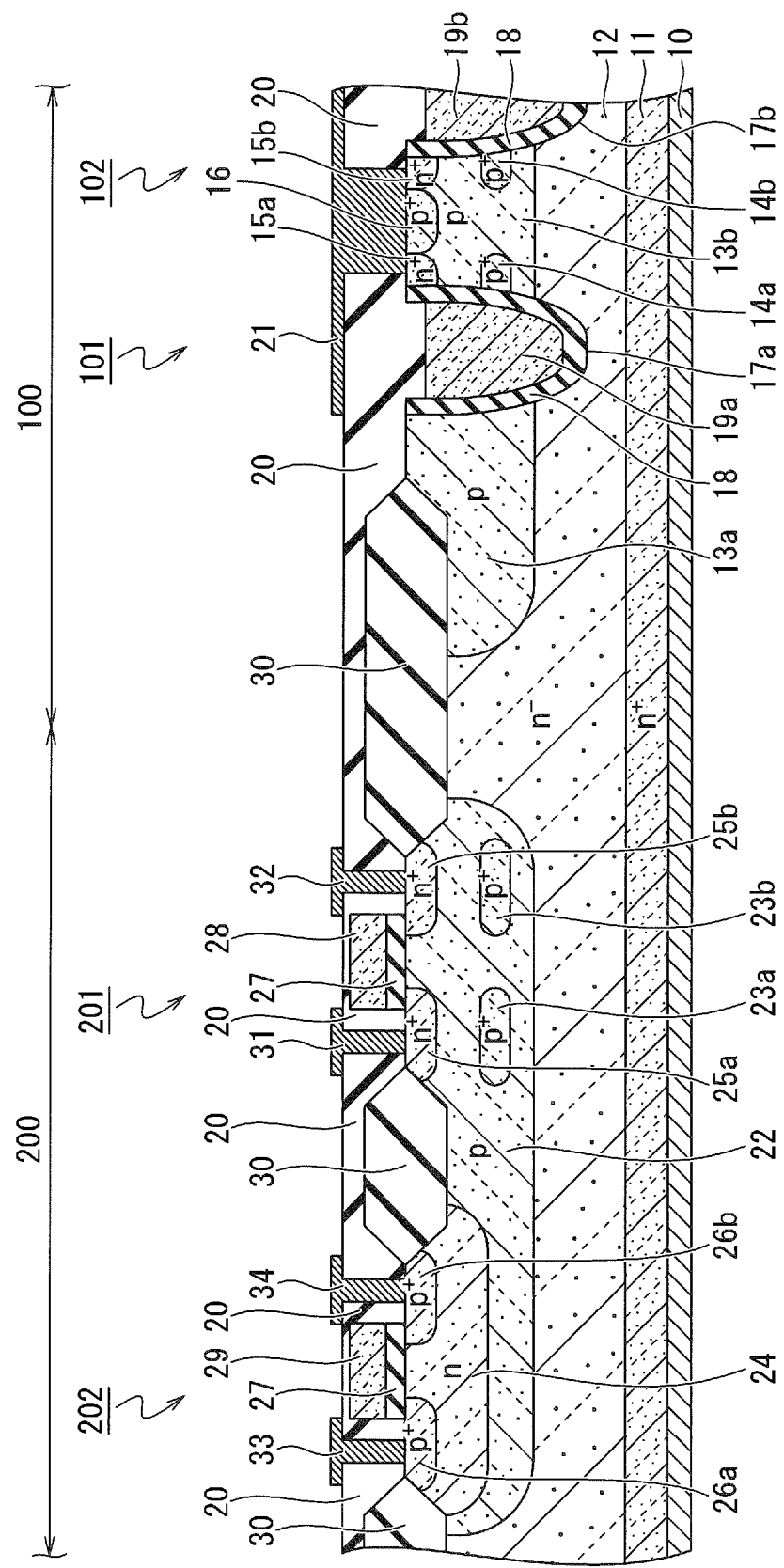
FIG. 24 is a cross-sectional view of main components illustrating an example of a semiconductor integrated circuit according to a fourth modified example of the embodiment of the present invention.

A semiconductor integrated circuit according to a fourth modified example of the embodiment of the present invention is different from the semiconductor integrated circuit according to the embodiment of the present invention illustrated in FIG. 1 in that, as illustrated in FIG. 24, two p$^+$-type circuit side buried layers 23a and 23b are provided so as to be separated from each other on the circuit unit 200 side and two p$^+$-type output side buried layers 14a and 14b are provided so as to be separated from each other on the output unit 100 side. The circuit side buried layers 23a and 23b are provided below the first terminal region 25a and the second terminal region 25b, respectively. The output side buried layers 14a and 14b are provided below the first main-electrode regions 15a and 15b, respectively.

At the time of manufacturing the semiconductor integrated circuit according to the fourth modified example of the embodiment of the present invention, the processes of forming the output side buried layer 14 and the circuit side buried layer 23 illustrated in FIGS. 11 and 12 are omitted. Alternatively, by using a mask having the same opening as the ion implantation mask 45 at the time of ion implantation for forming the first terminal region 25a, the second terminal region 25b, and the first main-electrode regions 15a and 15b illustrated in FIG. 16, the ion implantation for forming the output side buried layers 14a and 14b and the circuit side buried layers 23a and 23b is performed, so that it is possible to suppress an increase in the number of processes. For example, ion implantation for forming the output side buried layers 14a and 14b and the circuit side buried layers 23a and 23b may be performed by using the ion implantation mask 45 in common. The ion implantation for forming the output side buried layers 14a and 14b and the circuit side buried layers 23a and 23b can be performed before or after the ion implantation for forming the first terminal region 25a, the second terminal region 25b, and the first main-electrode regions 15a and 15b.

Fifth Modified Example

Figure 25:
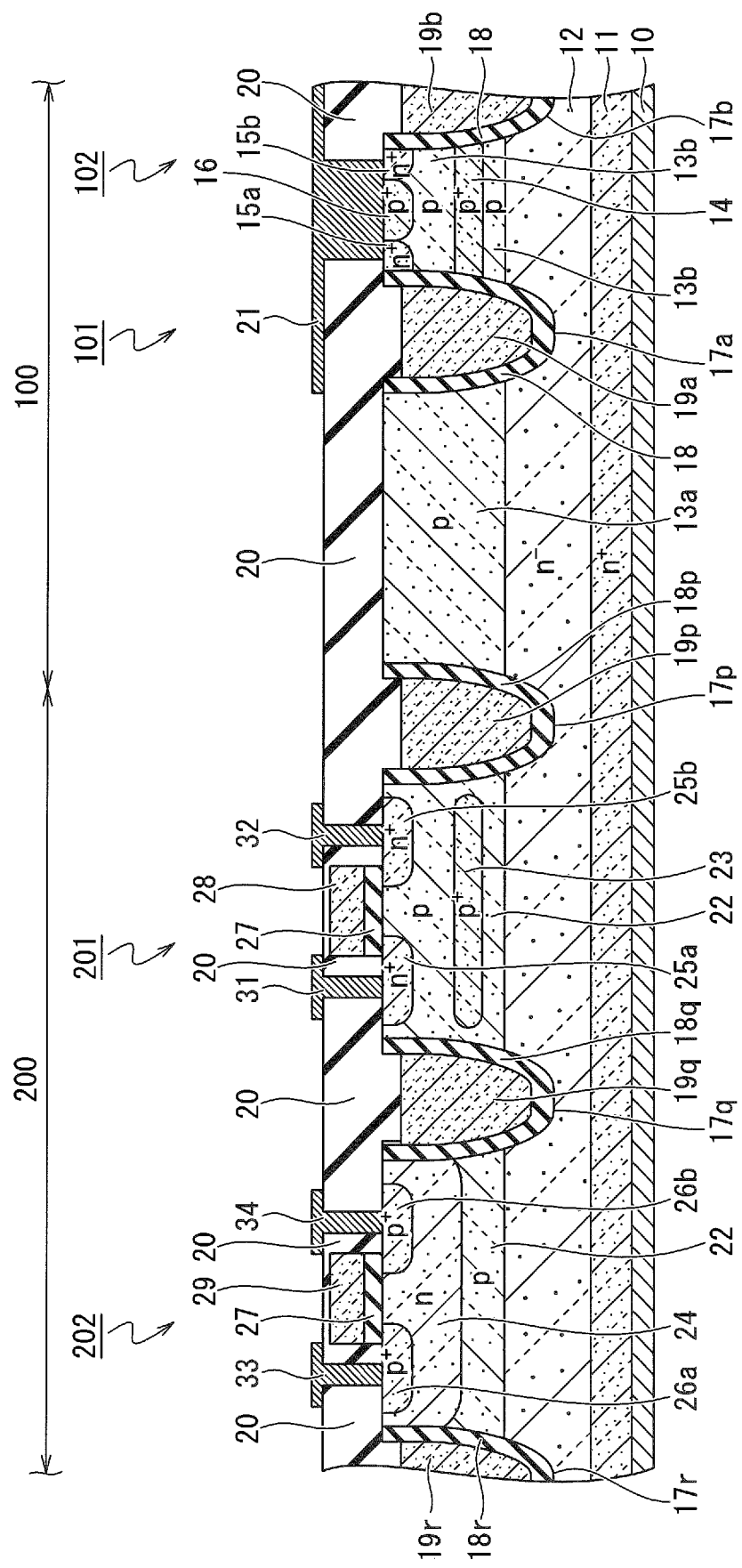
FIG. 25 is a cross-sectional view of main components illustrating an example of a semiconductor integrated circuit according to a fifth modified example of the embodiment of the present invention.

A semiconductor integrated circuit according to a fifth modified example of the embodiment of the present invention is different from the semiconductor integrated circuit according to the embodiment of the present invention illustrated in FIG. 1 in that, as illustrated in FIG. 25, the output stage element (101, 102), the first circuit element 201, and the second circuit element 202 are isolated by element isolation trenches 17p, 17q, and 17r through shallow trench isolation (STI). The element isolation trenches 17p, 17q, and 17r have the same shape as the gate trenches 17a and 17b. The element isolation trenches 17p, 17q, and 17r penetrate through the body region 13a and the first well region 22 and reach the support layer 12.

Element isolation insulating films 18p, 18q, and 18r are provided along the inner surfaces of the element isolation trenches 17p, 17q, and 17r. Dummy electrodes 19p, 19q, and 19r are buried in element isolation trenches 17p, 17q, and 17r through the element isolation trenches 17p, 17q, and 17r. The dummy electrodes 19p, 19q, and 19r may be in a floating state or may be connected to the lowest potential (for example, ground potential) to which the first circuit element 201 is connected. The element isolation structure configured with the element isolation trenches 17p, 17q, and 17r, the element isolation insulating films 18p, 18q, and 18r, and the dummy electrodes 19p, 19q, and 19r may be formed at the same time as the process of forming the control electrode structure (18, 19a, 19b).

According to the semiconductor integrated circuit according to the fifth modified example of the embodiment of the present invention, by providing the circuit side buried layer 23, since the bottom plane of the first well region 22 is formed to be shallower than the bottom planes of the gate trenches 17a and 17b, the element isolation by STI becomes easy. By using the element isolation trenches 17p, 17q and 17r by STI instead of the field oxide film 30 formed by the LOCOS method, since the widths of the element isolation trenches 17p, 17q and 17r are narrower than the width of the field oxide film 30, it is possible to realize a semiconductor integrated circuit with a higher integration density.

Next, an example of a method of manufacturing a semiconductor integrated circuit according to the fifth modified example of the embodiment of the present invention will be described. First, similarly to the embodiment of the present invention, as illustrated in FIG. 6, a semiconductor substrate (Si wafer) made of $n^+$-type silicon (Si) is prepared as a back surface contact layer 11, and an $n^-$-type support layer 12 is epitaxially grown on the back surface contact layer 11, so that a semiconductor base body (11, 12) having a double-layer structure is formed.

Figure 26:
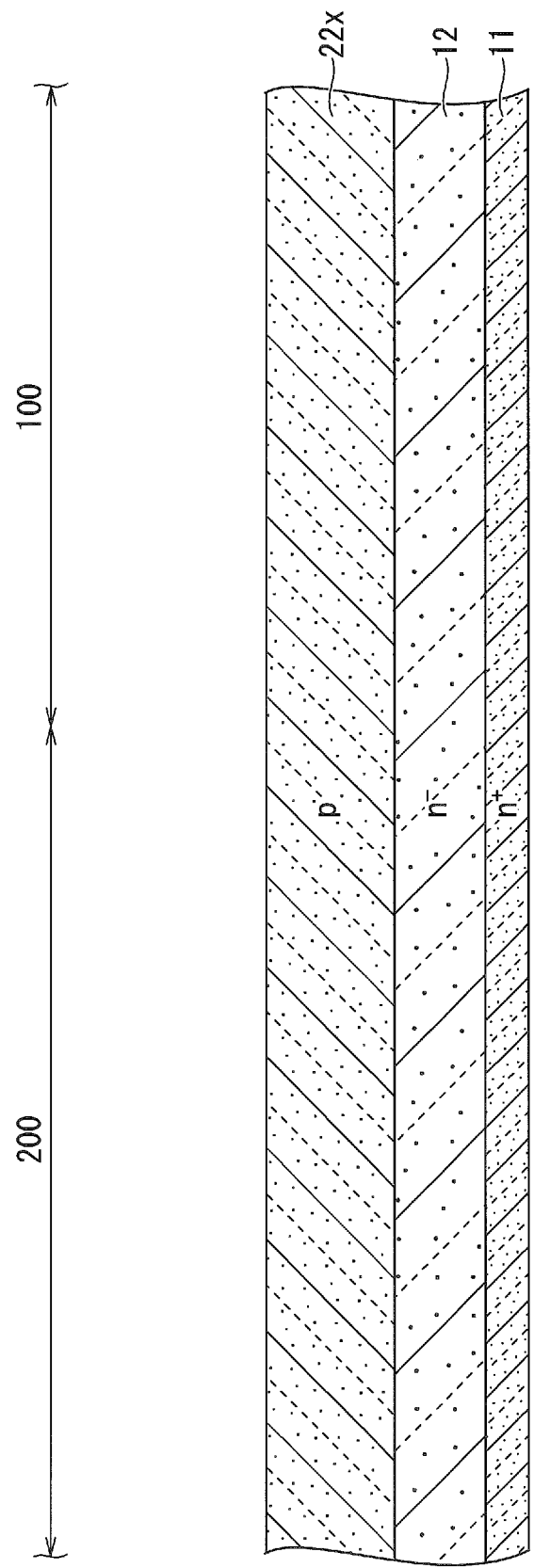
FIG. 26 is a process cross-sectional view illustrating an example of a method of manufacturing a semiconductor integrated circuit according to the fifth modified example of the embodiment of the present invention.

Next, impurity ions exhibiting p-type such as boron (B) ions are selectively implanted into the upper surface of the support layer 12. After that, the impurity ions are activated and thermally diffused by annealing. As a result, as illustrated in FIG. 26, a p-type well region (common well region) 22x is formed in an upper portion of the support layer 12 over the entire of the output unit 100 and the circuit unit 200.

Figure 27:
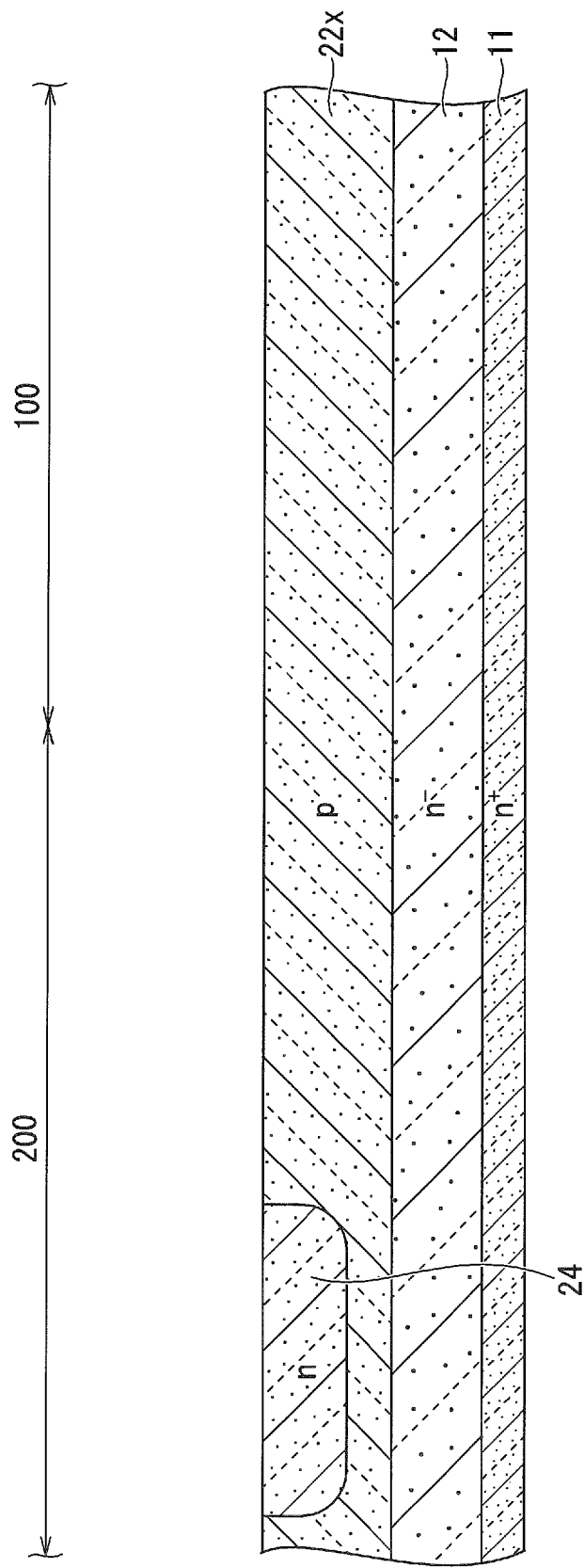
FIG. 27 is a process cross-sectional view continued from FIG. 26 illustrating the example of the method of manufacturing a semiconductor integrated circuit according to the fifth modified example of the embodiment of the present invention.

Next, a photoresist film is applied on the well region 22x, and the photoresist film is delineated by using a photolithography technique. By using the delineated photoresist film as an ion implantation mask, impurity ions exhibiting n-type such as phosphorus (P) ions are selectively implanted into the upper surface of the well region 22x. After that, the photoresist film used as the ion implantation mask is removed, and after that, the impurity ions are activated and thermally diffused by annealing. As a result, as illustrated in FIG. 27, an n-type second well region 24 is selectively formed in an upper portion of the well region 22x on the circuit unit 200 side.

Figure 28:
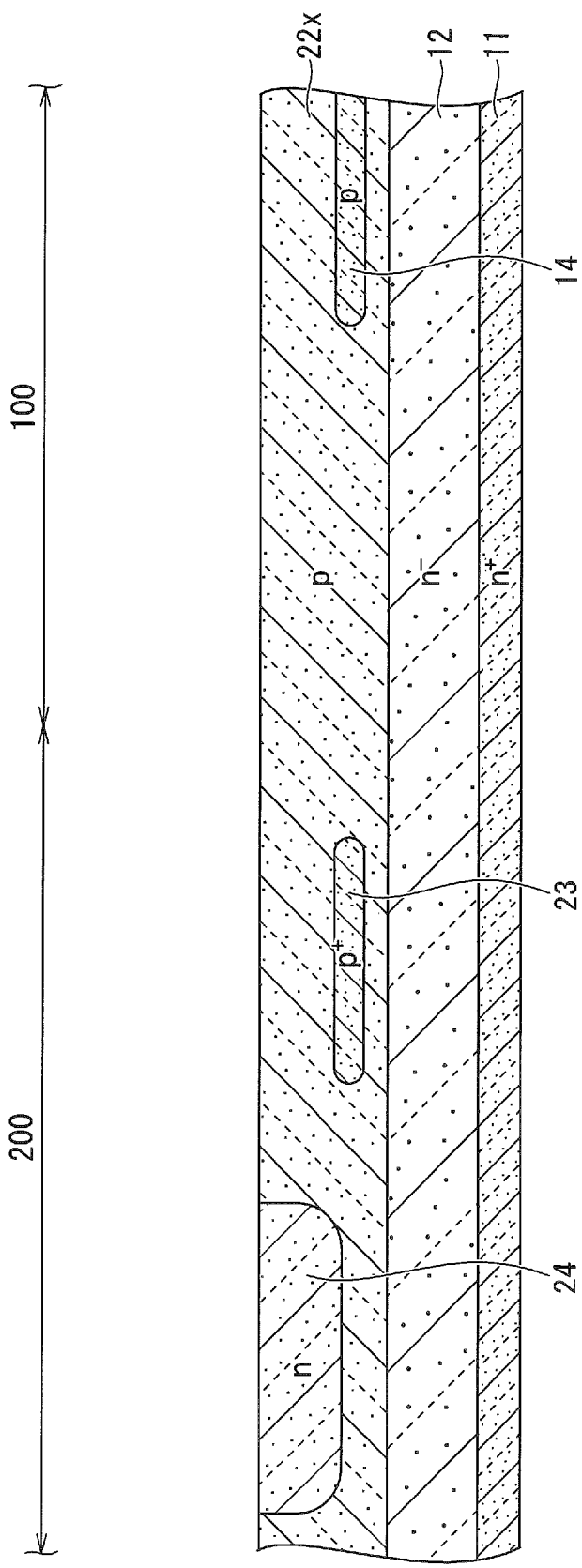
FIG. 28 is a process cross-sectional view continued from FIG. 27 illustrating the example of the method of manufacturing a semiconductor integrated circuit according to the fifth modified example of the embodiment of the present invention.

Next, a photoresist film is applied on the well region 22x and the second well region 24, and the photoresist film is delineated by using a photolithography technique. By using the delineated photoresist film as an ion implantation mask, impurity ions exhibiting p-type such as boron (B) ions and aluminum (Al) ions are selectively implanted into the upper surface of the well region 22x. At this time, ion implantation is performed with a high acceleration voltage so that the deep position in the lower portion of the well region 22x becomes the projection range. Next, the photoresist film used as the ion implantation mask is removed. After that, the impurity ions are activated by annealing, but by shortening the thermal processing time of the activation, it is possible to suppress the diffusion in the depth direction and form the diffusion layer with a narrow width in the depth direction. That is, as illustrated in FIG. 28, the $p^+$-type circuit side buried layer 23 and the $p^+$-type output side buried layer 14 are limitedly formed in the lower portion of the well region 22x so as to be separated from each other with narrow widths in the depth direction.

Figure 29:
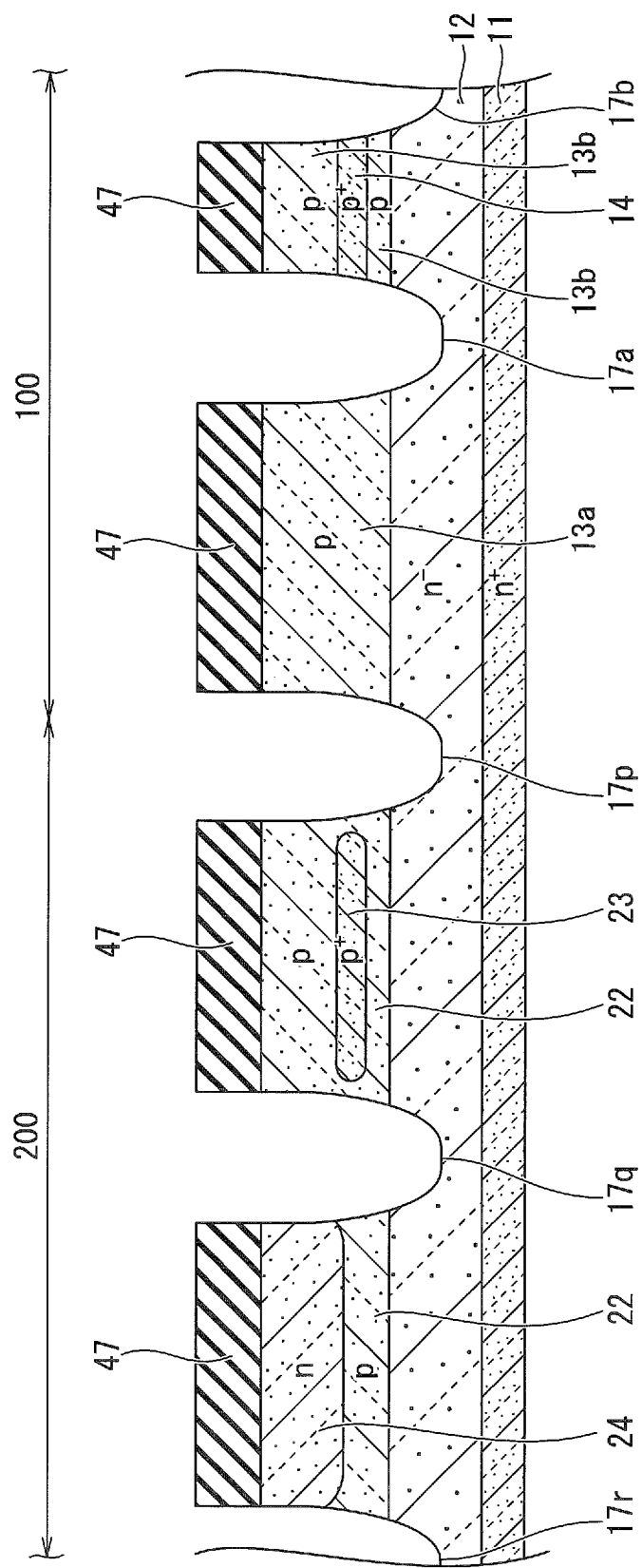
FIG. 29 is a process cross-sectional view continued from FIG. 28 illustrating the example of the method of manufacturing a semiconductor integrated circuit according to the fifth modified example of the embodiment of the present invention.

Next, a protective oxide film 47 is deposited on the well region 22x and the second well region 24 by a CVD method or the like, and the protective oxide film 47 is delineated by using a photolithography technique. By dry etching such as RIE or the like by using the delineated protective oxide film 47 as an etching mask, as illustrated in FIG. 29, the gate trenches 17a and 17b and the element isolation trenches 17p, 17q, and 17r which are formed in an upper portion of the semiconductor base body (11, 12) are selectively dug down to a depth penetrating through the well region 22x. The well region 22x is isolated into a plurality of regions by the gate trenches 17a and 17b and the element isolation trenches 17p, 17q, and 17r. That is, the first well region 22 provided with the circuit side buried layer 23 and the second well region 24 is formed on the circuit unit 200 side, and the body regions 13a and 13b provided with the output side buried layer 14 is formed on the output unit 100 side. After that, the protective oxide film 44 used as the etching mask is removed.

Figure 30:
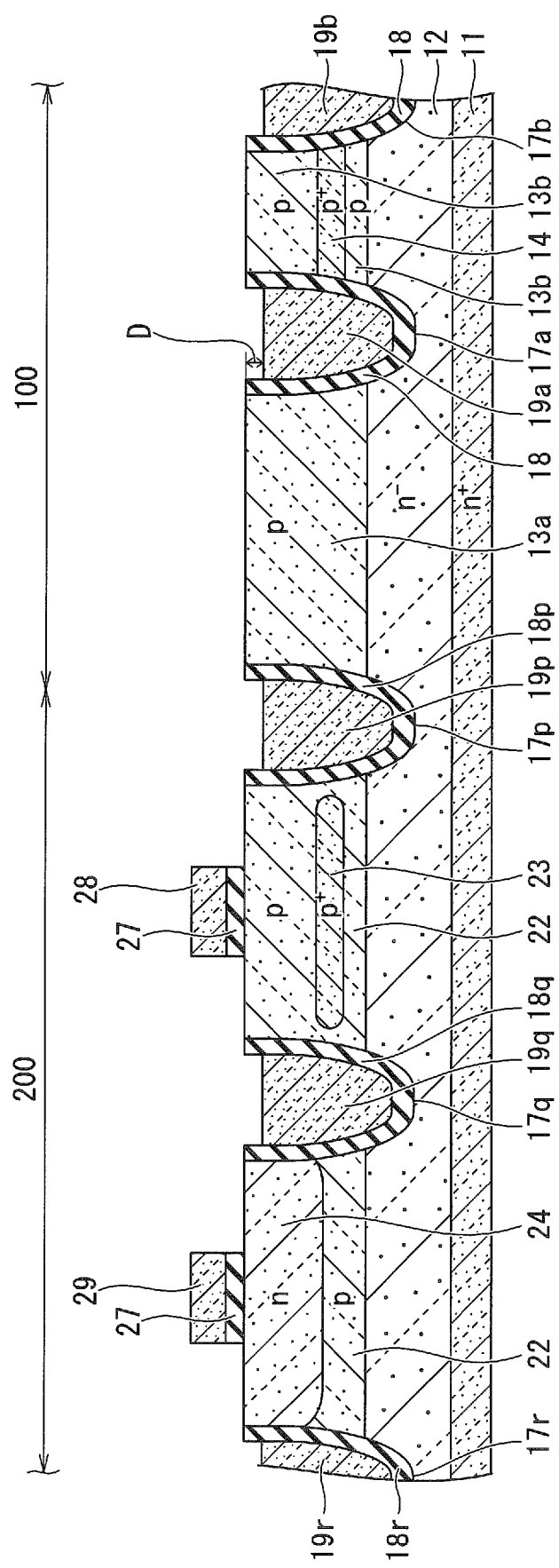
FIG. 30 is a process cross-sectional view continued from FIG. 29 illustrating the example of the method of manufacturing a semiconductor integrated circuit according to the fifth modified example of the embodiment of the present invention.

Next, an insulating film is formed on the first well region 22, the second well region 24, and the body regions 13a and 13b on the inner walls of the gate trenches 17a and 17b, and the element isolation trenches 17p, 17q, and 17r by a thermal oxidation method or the like. Next, a DOPOS layer is deposited in the gate trenches 17a and 17b and the element isolation trenches 17p, 17q, and 17r on the insulating film by a CVD method or the like. A photoresist film is applied on the DOPOS layer, and the photoresist film is delineated by using a photolithography technique. By dry etching such as RIE or the like by using the delineated photoresist film as an etching mask, the DOPOS layer and the insulating film are patterned. After that, the photoresist film used as the etching mask is removed. As a result, as illustrated in FIG. 30, the gate insulating films 18 and 27 and the element isolation insulating films 18p, 18q, and 18r configured with the insulating film and the gate electrode 28, the gate electrode 29, the gate electrodes 19a and 19b, and the dummy electrodes 19p, 19q, and 19r configured with the DOPOS layer are formed. At this time, in order to prevent the DOPOS from remaining as an etching residue on the surface of the support layer 12, since the DOPOS layer is etched under the condition of overetching, the DOPOS layer as the gate electrodes 19a and 19b and the dummy electrodes 19p, 19q, and 19r is excessively removed, so that the upper portions of the gate electrodes 19a and 19b and the dummy electrodes 19p, 19q, and 19r drop below the upper ends of the gate trenches 17a and 17b.

Since the subsequent procedure is substantially the same as that of the method of manufacturing the semiconductor integrated circuit according to the embodiment of the present invention illustrated in FIGS. 16 to 20, redundant description will be omitted.

OTHER EMBODIMENTS

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

For example, in the embodiment, the trench gate MOSFET is exemplified as the output stage element (101, 102) of the output unit 100, but the present invention is not limited thereto. For example, the output stage element may be a trench gate IGBT. In addition, although the CMOS configured with the first circuit element 201 and the second circuit element 202 of the circuit unit 200 is exemplified, the embodiment is not limited to the CMOS, and a control circuit configured with other semiconductor elements may be used.

In addition, in the embodiment, a case where Si is used as the semiconductor base body (11, 12) is exemplified. However, the embodiment can be applied to even the case a semiconductor (wide band gap semiconductor) material having a wider forbidden band than Si such as a silicon carbide (SiC), a gallium nitride (GaN), a diamond or an aluminum nitride (AlN) besides Si is used.

In addition, in FIG. 1, in the semiconductor base body (11, 12), the structure in which the n$^-$-type support layer 12 is epitaxially grown on the back surface contact layer 11 configured with the n$^+$-type semiconductor substrate is exemplified, but the structure is not limited thereto. For example, instead of the back surface contact layer 11, an n$^+$-type buried layer epitaxially grown on a p-type support substrate (semiconductor wafer) may be used, and the n$^-$-type support layer 12 may be epitaxially grown on the n$^+$-type buried layer, so that a semiconductor base body having a triple-layer structure may be configured. In the case of a semiconductor base body having a triple-layer structure using an n$^+$-type buried epitaxial layer instead of the back surface contact layer 11, a sinker region reaching the buried epitaxial layer from the upper surface of the support layer 12 may be provided. That is, the support layer 12 may be connected from the upper surface side of the support layer 12 to the n$^+$-type buried epitaxial layer functioning as the drain region through the sinker region. In this case, the drain electrode wiring is stacked on the upper surface side of the support layer 12. In the case of using an n$^+$-type buried epitaxial layer instead of the back surface contact layer 11, the support substrate on the back surface side may be configured with an SOI structure as an insulator substrate.

As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A method of manufacturing a semiconductor integrated circuit, comprising:
   forming a body region having a second conductivity type in an upper portion of a support layer having a first conductivity type;
   forming a well region having the second conductivity type in the upper portion of the support layer and separated from the body region;
   forming an output side buried layer having the second conductivity type and having an impurity concentration higher than that of the body region, inside the body region;
   forming a circuit side buried layer having the second conductivity type and having an impurity concentration higher than that of the well region, inside the well region;
   digging a gate trench penetrating through the body region and reaching the support layer;
   burying a control electrode structure in the gate trench;
   forming first and second terminal regions having the first conductivity type on the well region so as to face each other; and
   forming an output terminal region having the first conductivity type on the body region, an output stage element having the output terminal region being controlled by a circuit element including the first and second terminal regions.

2. The method of manufacturing a semiconductor integrated circuit of claim 1, wherein the forming of the output side buried layer and the forming of the circuit side buried layer are performed at the same time.

3. The method of manufacturing a semiconductor integrated circuit of claim 1, wherein the forming of the body region and the forming of the well region are performed at the same time.

4. The method of manufacturing a semiconductor integrated circuit of claim 1, wherein the forming of the first and second terminal regions and the forming of the output terminal region are performed at the same time.

5. The method of manufacturing a semiconductor integrated circuit of claim 1, wherein the forming the output side buried layer and the forming the circuit side buried layer are performed by ion implantation using a mask having the same opening as an ion implantation mask for forming the output terminal region and the first and second terminal regions.

6. A method of manufacturing a semiconductor integrated circuit, comprising:
- forming a well region having a second conductivity type in an upper portion of a support layer having a first conductivity type;
- forming a circuit side buried layer having the second conductivity type and having an impurity concentration higher than that of the well region, inside the well region;
- forming an output side buried layer having the second conductivity type and having an impurity concentration higher than that of the well region, inside the well region and separated from the circuit side buried layer;
- digging an element isolation trench penetrating through the well region and reaching the support layer, and isolating the well region into a plurality of regions to form a first well region provided with the circuit side buried layer and a body region provided with the output side buried layer;
- digging a gate trench penetrating through the body region and reaching the support layer at the same time as the digging the element isolation trench;
- burying a control electrode structure in the gate trench;
- forming first and second terminal regions having the first conductivity type, on the first well region to face each other; and
- forming an output terminal region having the first conductivity type, on the body region, an output stage element having the output terminal region being controlled by a circuit element including the first and second terminal regions.

* * * * *